(12) United States Patent
Kuznetsov et al.

(10) Patent No.: US 10,162,075 B2
(45) Date of Patent: Dec. 25, 2018

(54) NON-COOPERATIVE AUTOMATIC SECURITY SCREENING WITH ANTENNAS FOR HIGH CROSS-POLARIZATION DISCRIMINATION

(71) Applicants: Andrey Kuznetsov, St. Petersburg (RU); Viktor Meshcheryakov, St. Petersburg (RU)

(72) Inventors: Andrey Kuznetsov, St. Petersburg (RU); Viktor Meshcheryakov, St. Petersburg (RU)

(73) Assignee: APSTEC SYSTEMS USA LLC, Owings Mills, MD (US)

( * ) Notice: Subject to any disclaimer, the term of this patent is extended or adjusted under 35 U.S.C. 154(b) by 0 days.

(21) Appl. No.: 15/891,589

(22) Filed: Feb. 8, 2018

(65) Prior Publication Data

US 2018/0172871 A1 Jun. 21, 2018

Related U.S. Application Data

(63) Continuation-in-part of application No. 15/613,832, filed on Jun. 5, 2017, now Pat. No. 9,928,425, which (Continued)

(51) Int. Cl.
G08B 13/196 (2006.01)
G01V 3/12 (2006.01)
(Continued)

(52) U.S. Cl.
CPC .............. *G01V 3/12* (2013.01); *G01R 27/267* (2013.01); *G01S 13/04* (2013.01); *G01V 8/005* (2013.01)

(58) Field of Classification Search
None
See application file for complete search history.

(56) References Cited

U.S. PATENT DOCUMENTS

| | | | | |
|---|---|---|---|---|
| 2005/0146441 A1* | 7/2005 | Akins | ...................... | G01V 3/08 340/693.5 |
| 2007/0096729 A1* | 5/2007 | Brunson | .............. | G01R 33/022 324/244 |
| 2007/0194976 A1* | 8/2007 | Reed | ....................... | G01S 7/024 342/22 |
| 2009/0010386 A1* | 1/2009 | Peschmann | .......... | G01N 23/223 378/57 |
| 2010/0332475 A1* | 12/2010 | Birdwell | ........... | G06F 17/30333 707/737 |

(Continued)

*Primary Examiner* — Eileen M Adams
(74) *Attorney, Agent, or Firm* — Nadya Reingand; Yan Hankin

(57) ABSTRACT

Methods and systems for detection of threats in secure areas are disclosed. Microwaves are transmitted into high traffic areas and are reflected off or transmitted through targets within that area. The resulting signals are detected at receiving antennas which are designed to have a high cross-polarization discrimination (XPD) such that co- and cross-polarizations of the resulting signals are separable for further processing. The receiving antennas of the present invention comprise elliptical antennas with a double-ridged waveguide on the interior and a conically-shaped exterior. This particular design for the receiving antennas allows to technologically obtain an XPD of about 30 dB or more for solid angles measured from a receiving antenna's boresight (the main lobe axis), and formed by rotating the corresponding 30-degree planar angle around the main lobe axis, the solid angles measuring approximately 0.84 sr, in a frequency range between 9.5 and 20 GHz.

20 Claims, 26 Drawing Sheets

Related U.S. Application Data is a continuation-in-part of application No. 15/596,345, filed on May 16, 2017, now Pat. No. 9,823,377, and a continuation-in-part of application No. 14/964,328, filed on Dec. 9, 2015, now Pat. No. 9,697,710, and a continuation-in-part of application No. 14/319,222, filed on Jun. 30, 2014, now Pat. No. 9,784,879, and a continuation-in-part of application No. 14/259,603, filed on Apr. 23, 2014, now Pat. No. 9,330,549, and a continuation-in-part of application No. 14/160,895, filed on Jan. 22, 2014, now Pat. No. 9,282,258, and a continuation-in-part of application No. 13/528,412, filed on Jun. 20, 2012, now Pat. No. 9,304,190.

(60) Provisional application No. 62/345,064, filed on Jun. 3, 2016.

(51) Int. Cl.
*G01R 27/26* (2006.01)
*G01S 13/04* (2006.01)
*G01V 8/00* (2006.01)

(56) References Cited

U.S. PATENT DOCUMENTS

| | | | | |
|---|---|---|---|---|
| 2011/0201911 | A1* | 8/2011 | Johnson | A61B 5/14532 600/365 |
| 2014/0021947 | A1* | 1/2014 | Gmajnic | G01V 3/087 324/252 |
| 2014/0104437 | A1* | 4/2014 | Chao | H04N 17/002 348/187 |
| 2014/0240128 | A1* | 8/2014 | Deangelo | G08B 13/08 340/545.2 |

* cited by examiner

NON-COOPERATIVE AUTOMATIC SECURITY SCREENING WITH ANTENNAS FOR HIGH CROSS-POLARIZATION DISCRIMINATION

CROSS-REFERENCE To RELATED APPLICATIONS

The present patent application claims priority to U.S. Provisional Patent Application Ser. No. 62/345,064, filed Jun. 3, 2016; it is also a Continuation in Part of U.S. Non-Provisional patent application Ser. No. 15/613,832, filed Jun. 5, 2017, which is a Continuation in Part of U.S. Non-provisional patent application Ser. No. 15/596,345, filed May 16, 2017, which is a Continuation in Part of U.S. Non-provisional patent application Ser. No. 14/964,328, filed Dec. 9, 2015 which is a Continuation in Part of U.S. Non-provisional patent application Ser. No. 14/319,222, filed Jun. 30 2014, which is a Continuation in Part of U.S. Non-provisional patent application Ser. No. 14/259,603, filed Apr. 23, 2014, currently issued as U.S. Pat. No. 9,330,549, issued May 3, 2016; and it is also a Continuation in Part of U.S. Non-provisional patent application Ser. No. 14/160,895, filed Jan. 22, 2014, currently issued as U.S. Pat. No. 9,282,258, issued Mar. 8, 2016; and it is also a Continuation in Part of U.S. Non-provisional patent application Ser. No. 13/528,412, filed Jun. 20, 2012, currently issued as U.S. Pat. No. 9,304,190, issued Apr. 5, 2016, all said applications and their disclosures being incorporated herein by reference in their entireties.

FIELD OF THE INVENTION

This invention is in the field of multiple threat detection systems. Particularly, this invention is in the field of detecting concealed or hidden improvised explosive devices (IEDs), metallic weapons and/or shrapnel, and radioactive and nuclear materials.

BACKGROUND ART

The closest threat detection system to the present invention is the Rapiscan Systems Secure 1000 SP. The Secure 1000 SP uses backscatter technology as well as image processing software and an operator interface to screen passengers for a wide range of potential threats including liquids, contraband, ceramics, explosives, narcotics, concealed currency and weapons. The Secure 1000 SP generates a front and back scan simultaneously. The Secure 1000 SP can detect small objects and threats concealed on a passenger. It can detect organic and inorganic threats, metals and non-metallic objects and can detect concealed liquids, ceramics, weapons, plastic explosives, narcotics, metals, contraband, currency etc. The Secure 1000 SP requires one pose with no additional movement by the passenger, a full scan can be completed in seconds. The Secure 1000 bounces very low dose of x-rays off of a person to generate an image. This image is then analyzed by an operator to identify concealed potential threats.

The Rapiscan Systems Secure 1000 is limited in that it requires a person to be in a single pose for scanning, it requires an operator to determine what threats are present and to review the scanned images, it uses x-rays for scanning, it only performs backscatter and no pass through imaging, at it is designed to work at a security checkpoint as opposed to use in an array where it can scan multiple individuals and their luggage without causing a security bottleneck. The Rapiscan Systems Secure 1000 is incapable of detecting radiation/nuclear materials.

There is a need for multi-threat detection systems with very short processing time allowing detection of a variety of threats simultaneously.

Most of the threat detection technologies that have been used in the security field so far require some cooperation from the inspected people. The degree of expected cooperation varies from relatively mild requirement to stand in certain position for a certain time to the ultimate "take everything out of your pockets" request. Whatever the cooperation requirements are, somebody has to ensure that the inspected people cooperate properly. This means that even for fully automatic systems, such as metal detectors, the performance will depend on the skills and motivation of the security staff, and the need to have such staff near every inspection system makes operational costs very high.

A direct consequence of the standard cooperative inspection approach is prohibitive cost of using existing inspection systems in crowded places: even for automatic detection systems, too much personnel would be needed to ensure that everybody cooperates properly.

The only widely used non-cooperative security-related hardware are CCTV cameras, which often work without people even knowing that they are viewed. However, CCTV cameras typically require human operators to interpret video stream, and are thus only useful after the incident has already happened. One of the main problems currently facing the security community is the growing dissatisfaction of the public and businesses with the high operational costs and disruptions of normal functioning of the protected sites that are often associated with current security measures. This dissatisfaction, which is for the most part totally justified, not only threatens to undermine the current achievements in the traditional security areas, such as aviation security, but also prevents deployment of security solutions to other high-risk locations, such as urban transport infrastructure (metro, trains, buses), mass sports and political events, government buildings etc.

Dramatic reduction of the operational costs and the inconveniences caused by security measures to the protected sites would thus be the key to maintaining and increasing both the level and proliferation of security measures.

SUMMARY OF THE INVENTION

The present invention uses microwave detection to find non-metallic objects that are hidden, it uses cross-polarized microwaves and passive magnetometry to detect hidden metallic weapons or shrapnel, and uses gamma ray detection to find radioactive materials. Each of these technologies provide threat detection, combined these technologies can provide detection of even more types of threats.

The present invention using microwave detection used in conjunction with cross-polarized microwave detection detects IEDs with shrapnel. When using microwave detection, reflective or pass through, dirty bombs are detectable. And the combination of cross polarized microwave detection with gamma detection allows for detection of radioactive/nuclear material that is shielded by metal.

The present invention allows for real time scanning of individuals, multiple individuals at once, for reflected microwave, cross polarized microwave, and radioactive/nuclear scanning either in a security checkpoint or in an open array/portal that people walk through. The devices in an array/portal can be disguised as advertisement space, information boards, etc. The present invention can be used in conjunction with facial recognition software to track a suspicious individual through a given space. The present invention can be use with a limited access entry portal that can isolate an individual to perform subsequent scans in order to determine, automatically, if a threat is detected or if there is a false alarm all while minimally disrupting throughput of the entry portal. The present invention can also be integrated into a system of multiple scan points and use subject tracking in order to perform additional scans and automatically determine threat presence. Furthermore, the invention can be practiced in an automatic manner or be reviewed by operators. The invention can also be used to perform pass through and radiation/nuclear scans of rolling luggage, handbags, briefcases, backpacks, etc. The present invention also performs automatic facial recognition from a distance, against a database of known or suspected terrorists and provide an alert. The present invention provides different alerts based upon the types of materials found.

An appreciation of other aims and objectives of the present invention and a more complete and comprehensive understanding of this invention may be achieved by referring to the drawings, and by studying the description of preferred and alternative embodiments.

BRIEF DESCRIPTION OF THE DRAWINGS

The present invention will now be discussed in further detail below with reference to the accompanying figures in which:

FIG. 4(*b*) shows an example of the location of explosives on the human body under the coat or other garment. FIGS. 4(*c*) and 4(*d*) show the optical paths and distances measured or calculated by the claimed invention in the case of hidden objects.

In FIG. 13, each bold line represents different levels of processing as related to the fast switching. The total time estimated for each specific switching is exemplified in the figure; for example, the lowest bold line represents a process of switching between individual transmitting antennas in an array of transmitters and the time required, according to the present invention, for information (statistic/data) collection by an individual transmitter (occurring in the order of $10^{-7}$ seconds). Summing all transmitter (Tx) switching, and combining all frequencies into one frame, the result in this particular example is at least 15 frames per second.

FIG. 14A shows a graph of cross-polarized vs. co-polarized amplitudes for (1, square points) a body without objects, (2, circular points) metals on a body (shrapnel and a gun), and (3, triangular points)) a dielectric on a body (wax). FIG. 14B shows a graph representing discrimination between a body without objects 41, a body with metals 42, and a body with dielectrics 43, obtained by employing an SVN algorithm with Principal Component Analysis (PCA) data pre-processing. FIG. 14A represents experimental data collected in Cross- and Co-polarized amplitudes. FIG. 14B represents the same data as in FIG. 14A but after pre-processing in the PCA algorithm, and in coordinates of the two main principal components 1 and 2. The PCA processing removes the influence of measurement units in raw data and can also removes noise components from raw data (e.g., when more than 2 "row" parameters are used). FIG. 14B represents, in particular regions, how to differentiate data for three different cases (even if some of points are very close to one another): body without objects 41, a body with metals 42, and a body with dielectrics 43. The Principal Component Analysis (PCA) algorithm used for pre-processing, as exemplified in FIG. 14B allows for differentiation of, e.g., row data which partly overlap, as exemplified in FIG. 14A. After the PCA processing, an appropriate classification algorithm can be used, such as, e.g., support vector machines or one of the following: Bayes classifier, neural networks, gradient boosted trees, K-nearest values, etc.

FIG. 24B shows the same cross-section but straight on.

FIG. 25B shows the same cross-section but straight on.

FIG. 26A shows a perspective cross-sectional view along the major axis of an exemplary high cross polarization discrimination receiving antenna according to the present invention. FIG. 26B shows the same cross-section but straight on.

DETAILED DESCRIPTION OF THE PREFERRED EMBODIMENTS

Figure 1:
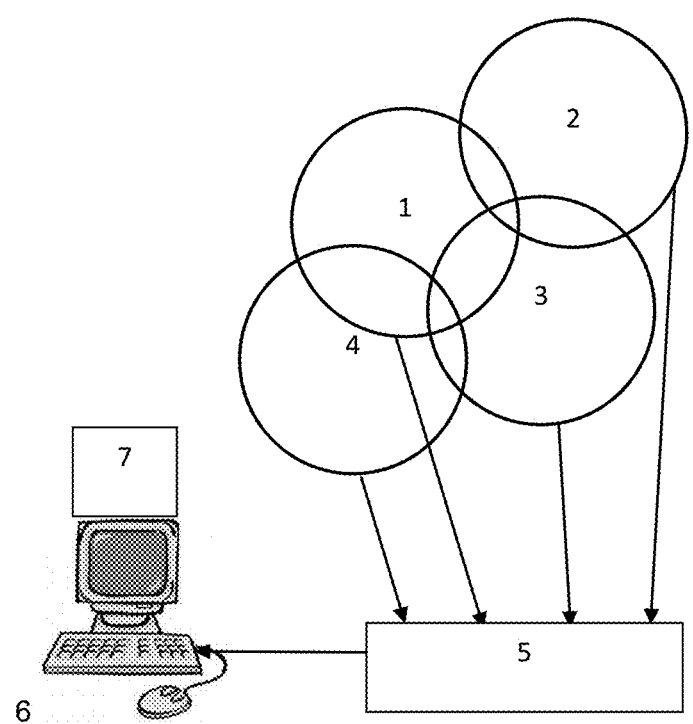
FIG. 1 provides a schematic block diagram of a multi-threat detection system.

In the following description, for purposes of explanation, specific examples are set forth to provide a thorough understanding of the present invention. However, it will be apparent to one skilled in the art that these specific details are not required in order to practice the present invention. The same techniques can easily be applied to other types similar systems.

The present invention is the first system/method capable of non-cooperative automatic security screening in crowded areas. It is operator-free and only notifies the security personnel about actual found threats without the need for constant monitoring/video or other data streams. This would lead to, among other benefits, a dramatic reduction of operational costs.

The present invention has been demonstrated to detect both metals (weapons), dielectrics (explosives), and mixed threats (e.g., improvised explosive devices, IEDs, with shrapnel) in real time and from a stand off distance, coupled with very low false alarm rates. Being a non-cooperative inspection system, the present invention causes very little inconvenience to the general public and, unlike prior art methods and systems, it causes no disturbance to the normal operation of a protected site.

As radio waves travel through the air, they travel in a way similar to waves of water moving across the surface of the ocean. The shape of a simple radio signal can be depicted as a repeated up and down movement or vibration. This up and down motion of the wave takes place in three dimensions. A wave which is polarized parallel to the plane of propagation is called a horizontally polarized wave. A wave which is polarized perpendicular to the plane of propagation is called a vertically polarized wave. The height or intensity of the wave is called the amplitude of the wave. The idea of polarization is applicable to all forms of transverse electromagnetic waves, whether they are radio waves at microwave frequencies, or light waves such as those emitted by a flashlight.

The power levels radiated by the present invention are much lower than conventional radar systems or than those generated by x-ray or other imaging systems that are currently employed to detect objects at the entry of an airport or a courtroom. In general, some of the preferred embodiments of the invention operate in the MHz or GHz frequency bands. Different radio or microwave frequencies offer different benefits and disadvantages for the object detection provided by the present invention. Although the description of some embodiments of the invention include specific references to particular frequency ranges, the system may be beneficially implemented using a wide variety of electromagnetic radiation bands.

Any threat detection system that would not require cooperation from the inspected people should meet the following minimal list of requirements:

(1) It should not require inspected people to alter their normal behavior in a significant way. At most, mild crowd control measures such as queue fences may be used. Ideally, the person would not even know about the fact of inspection.

(2) It should not require constant attention from security personnel, who would only occasionally receive information about an alarm via network (possibly, wireless), and may be busy with other things rest of the time.

(3) It must be followed by an established procedure to resolve alarms, e.g. diverting people who caused alarms for additional inspection, automatically controlling some access blocking system, using face recognition or other analytic software, etc.

(4) It should have very low false alarm rate, so that it would not cause inconvenience to the security personnel, the public, or the protected site.

(5) It should have high throughput and work unattended in an operator-free mode, so that no queues are created in the place of inspection.

If these requirements are met, the system would not interfere with the normal operations of the protected site, and operational costs would be very low due to savings on personnel.

The present invention is based on sending very low-power centimeter radio waves into a wide-angle area, and receiving and analyzing scattered and transmitted waves. Different types of materials produce distinctively different responses to radio waves. It has also been found that the human body is a good reflector for radio waves in the used frequency range, so it looks like a large reflective surface; that dielectrics are partially transparent for radio waves and have a refractive index larger than 1, which leads to the apparent increase of the flight path traveled by the wave between the emitter and the receiver; and that the edges of metallic objects lead to a rotation of the polarization of the incident wave.

The principles behind the present invention have are described herein. The systems of the present invention comprise a flexible system that can be implemented in a portal configuration, as a longer-range flat-panel configuration, or as a combination of the two. The present invention operates in two distinct modes: "reflection" and "transmission."

In the stand-off (i.e. far range) "reflection" mode, the system measures the radio waves reflected from objects in different polarizations. The position of scatterers with different reflecting properties on the scene are then reconstructed from the measured complex electromagnetic field using high-speed parallel processing units. The obtained distribution of scatterers may then be compared to an optical or depth image of the scene. Properties of found dielectrics, such as thickness, shape, and permittivity, can be obtained from subsequent automatic analysis and used in the decision-making procedure to distinguish between dangerous and benign objects. Analysis of the response of the scene in different polarizations allows for detection of metallic objects.

In the close-range "transmission" mode the system measures the time shift and amplitude of electromagnetic waves passing right through the dielectric when the person is between the emitting and receiving antennae. Any apparent increase of the flight path signals a potential presence of a substance with a refractive index larger than 1, as calculated between the antennae. Further analysis involving, e.g., building multiple tomographic images at different time slices allows an operator to detect the presence of dielectric objects on a human body, in backpacks, or in wheeled luggage.

The present invention collects data at a rate of tens of frames per second and then analyzes them using high-speed parallel processing units, thus achieving true real time differentiation and performance.

The system may be complemented by additional video or depth sensors, so that a photograph of a suspect carrying a threat as well as superimposed information about the threat location and threat type may also be sent through an existing security network. Alternatively, the present invention has its own user interface, which runs on a remote device and can accumulate information from several systems. There is no need for any staff member or employee to constantly monitor the data from the system: in a preferred embodiment, the system only sends information when a threat has been detected.

The present invention fulfills the following requirements for a system capable of non-cooperative operation in crowded environments without disrupting normal operation of the site: (1) it is fully automatic and operator-free; (2) it works in real time from standoff distance of several meters; (3) it inspects multiple people simultaneously; (4) it can detect a wide range of threats, including improvised ones; (5) it has very low false alarm rate.

Detection of Metallic Weapons and Shrapnel. Metallic threats are detected by automatically comparing relative intensities of signals reflected from some point with different polarizations. The radio waves emitted towards the scene are polarized along one or several directions. Reflected waves are measured both in the same and in the orthogonal polarization to the incident one. Metallic objects having a complex shape, such as guns, tend to rotate the polarization of the incident wave by 90 degrees. Distributions of the reflecting points across the scene measured in two orthogonal polarizations are automatically compared, and regions with excess cross-polarized component are marked as potential metallic anomalies. Parameters and trajectories of these anomalies are then automatically tracked within many consecutive frames, and compared with the location of dielectric objects found by the respective algorithms. Then the decision is made whether the anomaly is the actual metallic object, an artifact, or part of a mixed (metal-dielectric) threat. This decision is made once an anomaly is detected. Whether that anomaly is a metallic object or an artifact is based on the number of total anomalies found on the same target during that target's presence in the inspection area. A mixed metal-dielectric threat may also be determined by comparing locations of total anomalies versus dielectric anomalies. The objects considered dangerous are reported to the user in the form of a photograph with superimposed rectangle showing the location of the threat.

Metal detection capability is currently implemented in the walk-through portal configuration of the present invention. Another way the present invention can detect large metallic objects hidden in luggage (e.g., of the type used in Boston Marathon attack on Apr. 15, 2013) is by detecting anomalous blocking of the radio waves passing through the backpack ("transmission") in conjunction with detection of the properties of reflected waves ("reflection"). This allows the system to detect large metallic objects in backpacks even if those objects do not have the characteristics that cause a strong cross-polarization effect.

Detection of Suicide Belts. Dielectrics are detected by automatically analyzing the areas with an apparent increase of the flight path of the wave on its way from emitter/transmitter to receiver. Depending on the configuration of the system and location of the moving person, this increase appears either on the reconstructed reflected field ("reflection" mode) or on the field transmitted through the dielectric ("transmission" mode). The capability to detect dielectrics has been demonstrated during testing at an industrial facility. The rate of false alarms was shown to be less than 1%, while the detection rate for realistic explosives and/or simulants of the same, used was about 90%. Additionally, even if the explosive charge is completely surrounded by shrapnel, it can still be detected by the characteristic signature of metals (see above regarding detection of metallic weapons and shrapnel).

Detection of Bombs in Luggage. The present invention may also look for threats not only on a human body but also in wheeled or carried luggage. The main difference between detecting explosives on a person versus in luggage is that a typical luggage item may contain large amounts of dielectric elements (e.g. clothes, shoes, paper, plastic), which should not be mistaken for an explosive substance. One can rely here on the fact that most explosives are somewhat denser than widespread benign dielectric materials. The typical density of a standard explosive is about 1.7 g/cm$^3$, while the density of clothes, shoes, dry paper, etc. is usually significantly lower. Thus, an explosive hidden among other dielectrics in a suitcase would appear to the system as a dielectric anomaly consisting of a dense, core surrounded by a less dense dielectric peel with both the core and the peel increasing the apparent path of the wave but to different degrees. The present invention uses a path-based "peeling" algorithm to separate the dense core of the anomaly from surrounding materials. Then the parameters such as apparent increase of the wave path, amplitude of the corresponding peak, volume of the anomaly, etc. are determined separately for the core and for the peel.

Figure 14A:
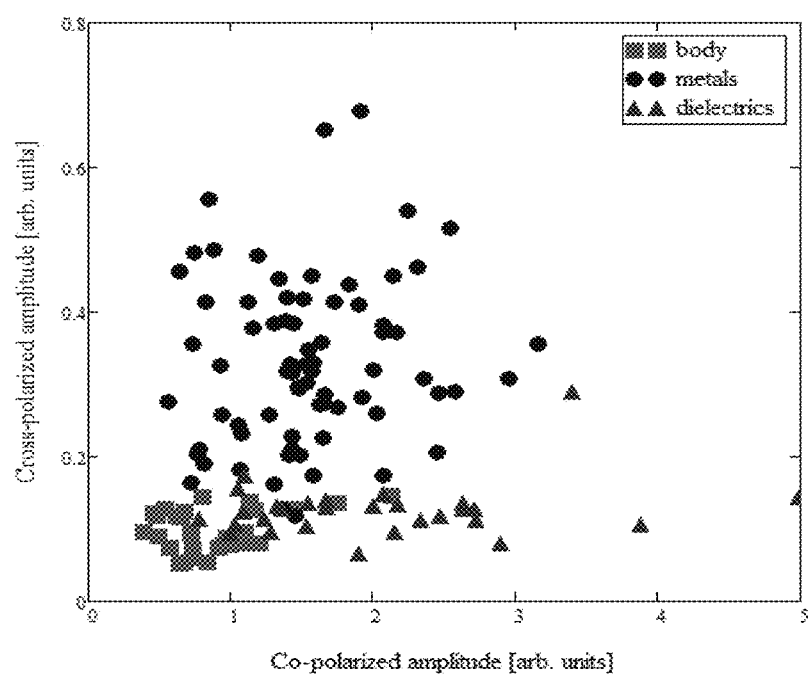
FIGS. 14A-14B.
Figure 14B:
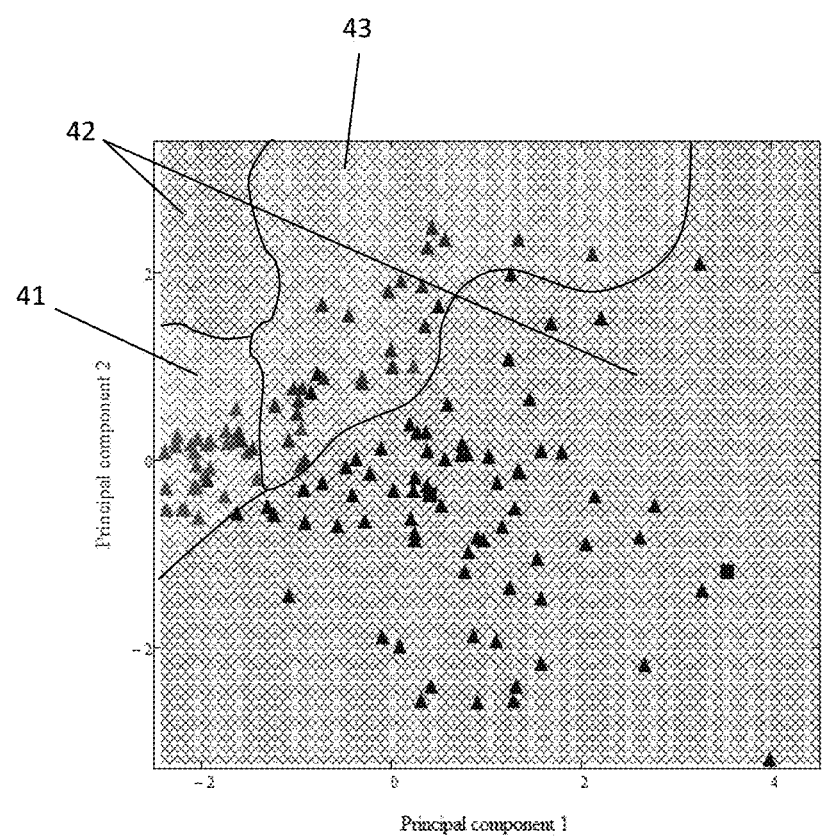
Figure 15:
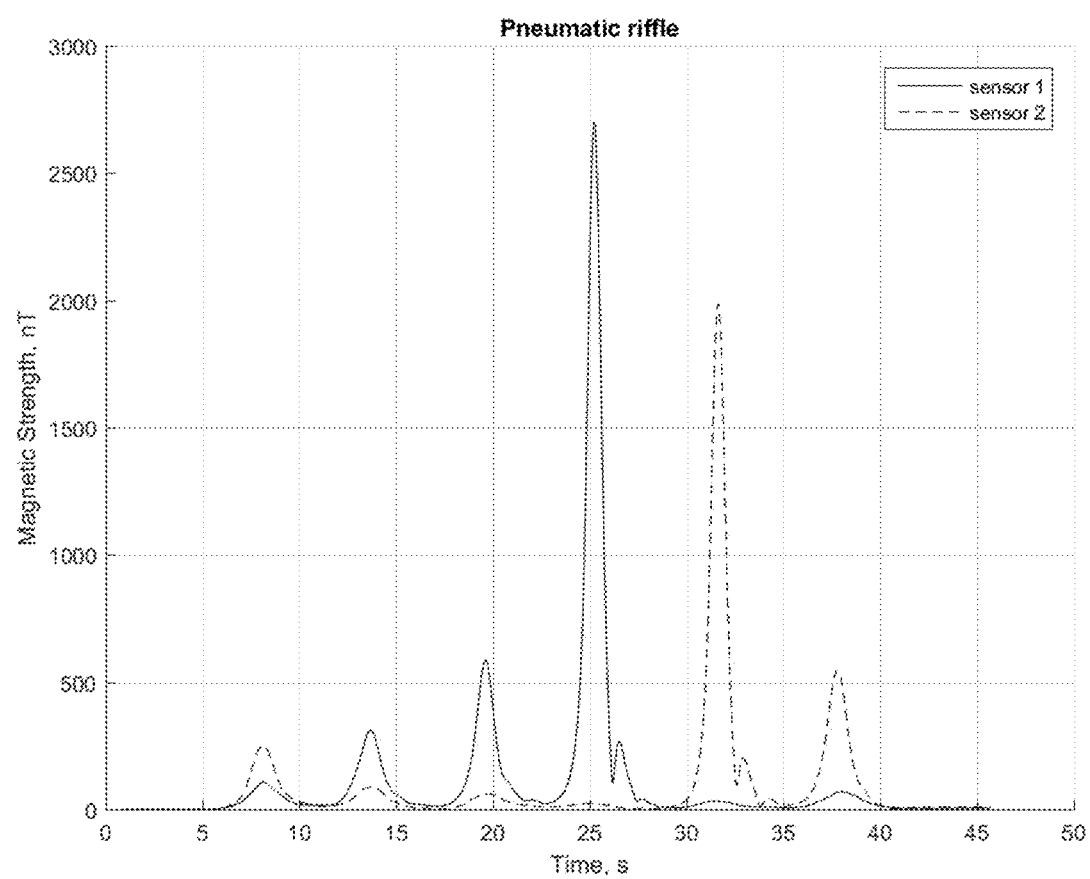
FIG. 15 shows a total magnetic strength effect in nT (nano Tesla) from a target/person moving/running with pneumatic rifle (with 40 cm ferromagnetic barrel) attached at one of the target's shoulders in vertical direction relative to the ground. The total magnetic strength effect means modulus of vector calculated from three axis' of magnetometer values in X, Y and Z directions. Each experiment (see FIGS. 15-21) runs for approximately 45 seconds, when the person had 3 runs (direct and back) at each at varying distances (middle of portal—120 cm approx. from both magnetometers (see two peaks at time interval 1-17 sec in X axis of FIG. 15, left—60 cm approx. from magnetometer #1 (sensor #1 on FIG. 15), and 180 cm from magnetometer #2 (sensor #2 on FIG. 15). see two peaks at time interval from 17-29 sec in X axis of FIG. 15, right—60 cm approx. from magnetometer #2 and 180 cm from magnetometer #1, see two peaks at time interval 29-41 sec in X axis of FIG. 15, within the portal created by the two magnetometers. The strength of the peaks are different depending on direct vs. back running, since the ferro object (as a rule) was attached at one of person side, meaning that the ferro objects are closer or further, respectively, from the magnetometer even if the person is moving/running along the same line of the portal.
Figure 16:
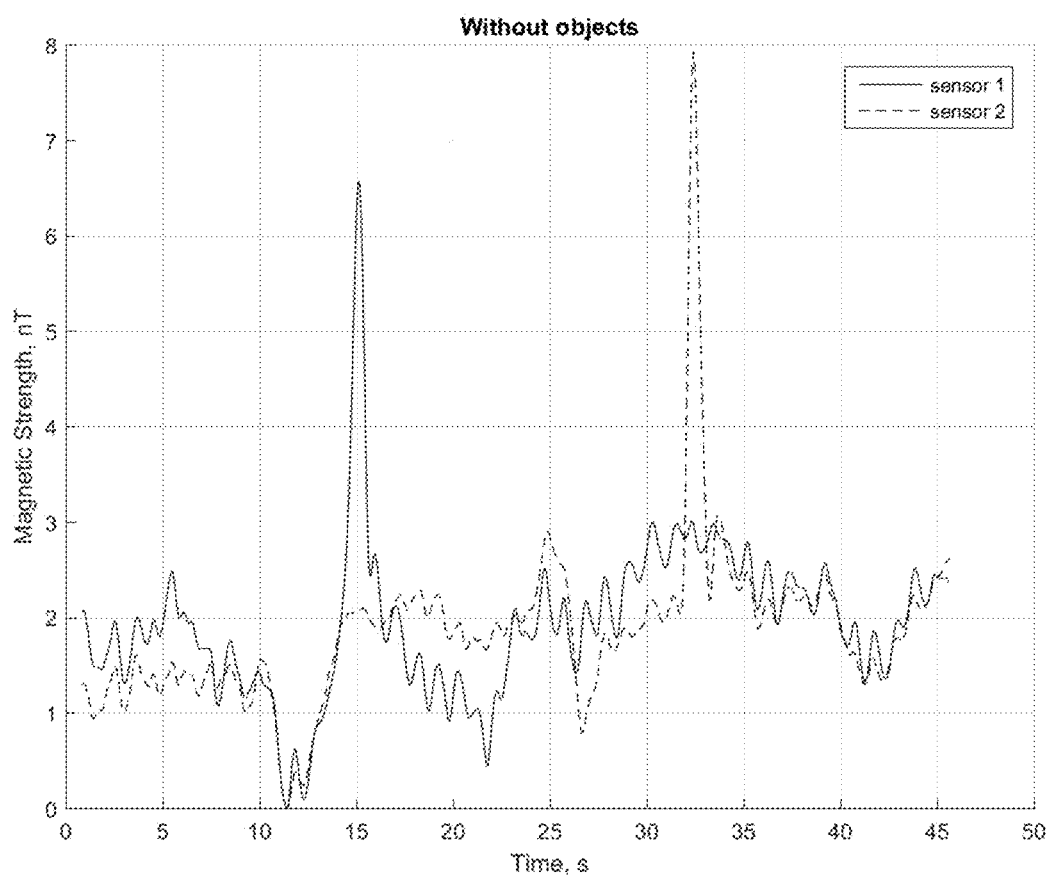
FIG. 16 shows total magnetic strength effect in nT (nano Tesla) from a person/target moving without any ferromagnetic metal. The path and time of the person running is the same as described at FIG. 15.
Figure 17:
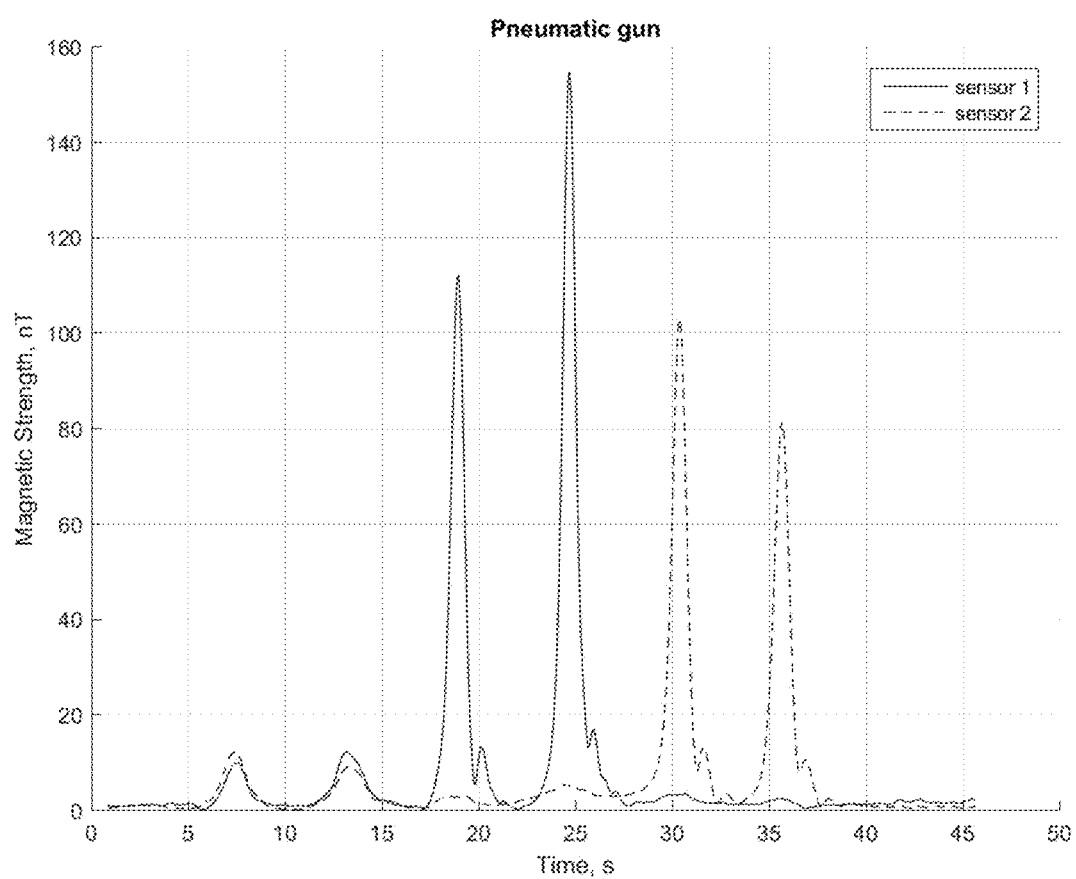
FIG. 17 shows total magnetic strength effect in nT (nano Tesla) from a person/target moving with a pneumatic gun (with a 10 cm ferromagnetic barrel) attached at one of the target's sides in a vertical direction relative to the ground. The path and time of the person moving is the same as described at FIG. 15.
Figure 18:
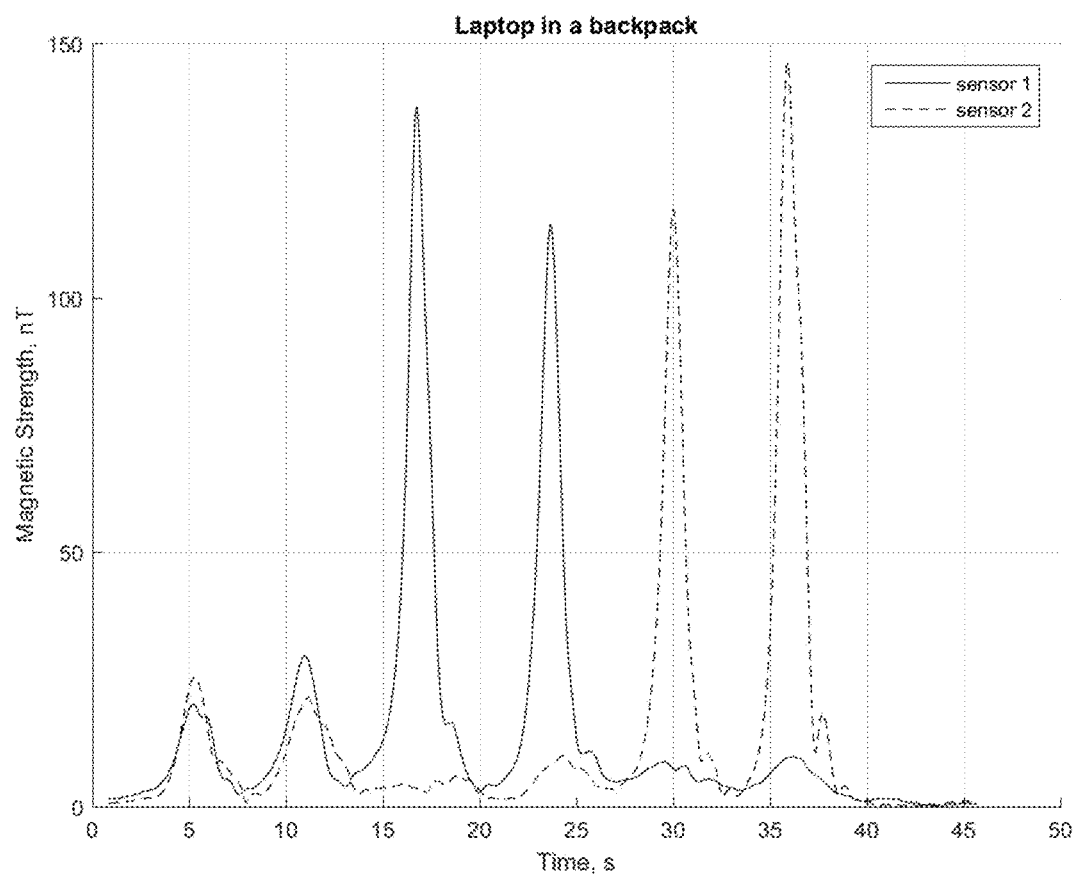
FIG. 18 shows total magnetic strength effect in nT (nano Tesla) from a person/target moving with a laptop in a rucksack. The path and time of the person moving/running is the same as described at FIG. 15.
Figure 19:
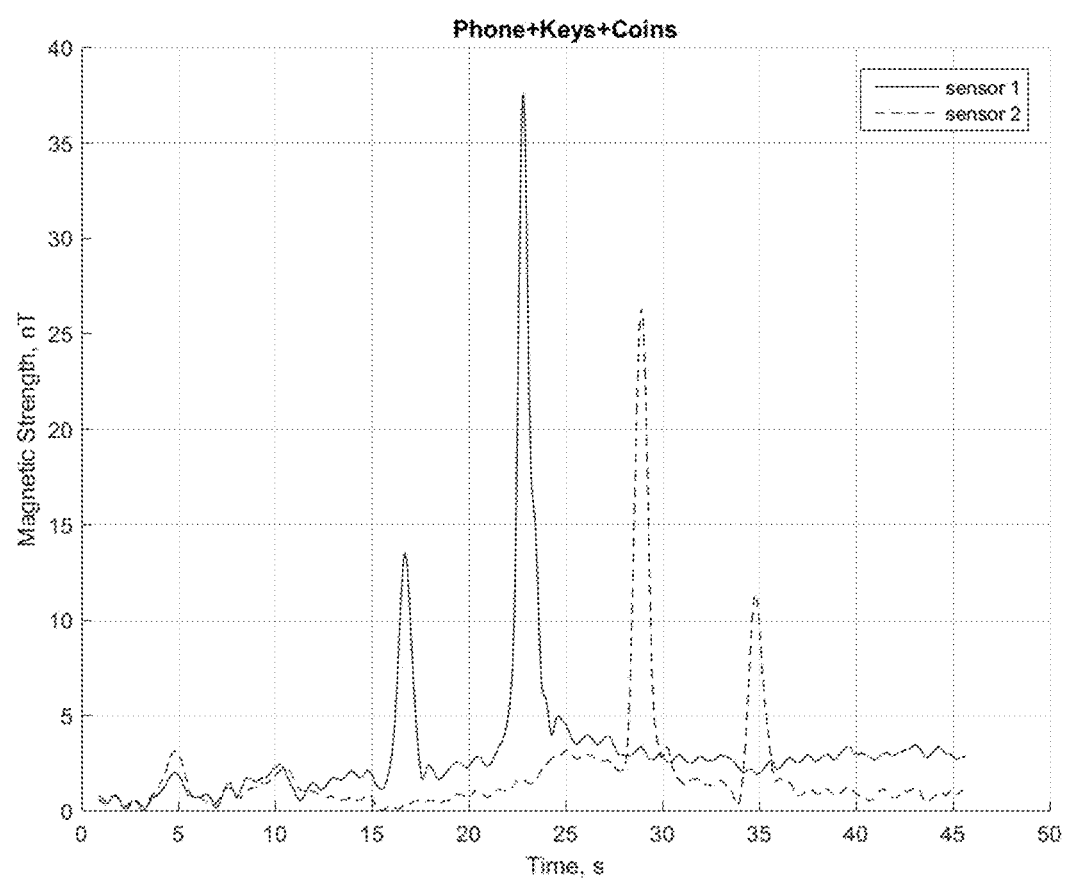
FIG. 19 shows total magnetic strength effect in nT (nano Tesla) from a person/target moving with a phone, keys and coins in the target's pockets. The path and time of the person moving/running is the same as described at FIG. 15.
Figure 20:
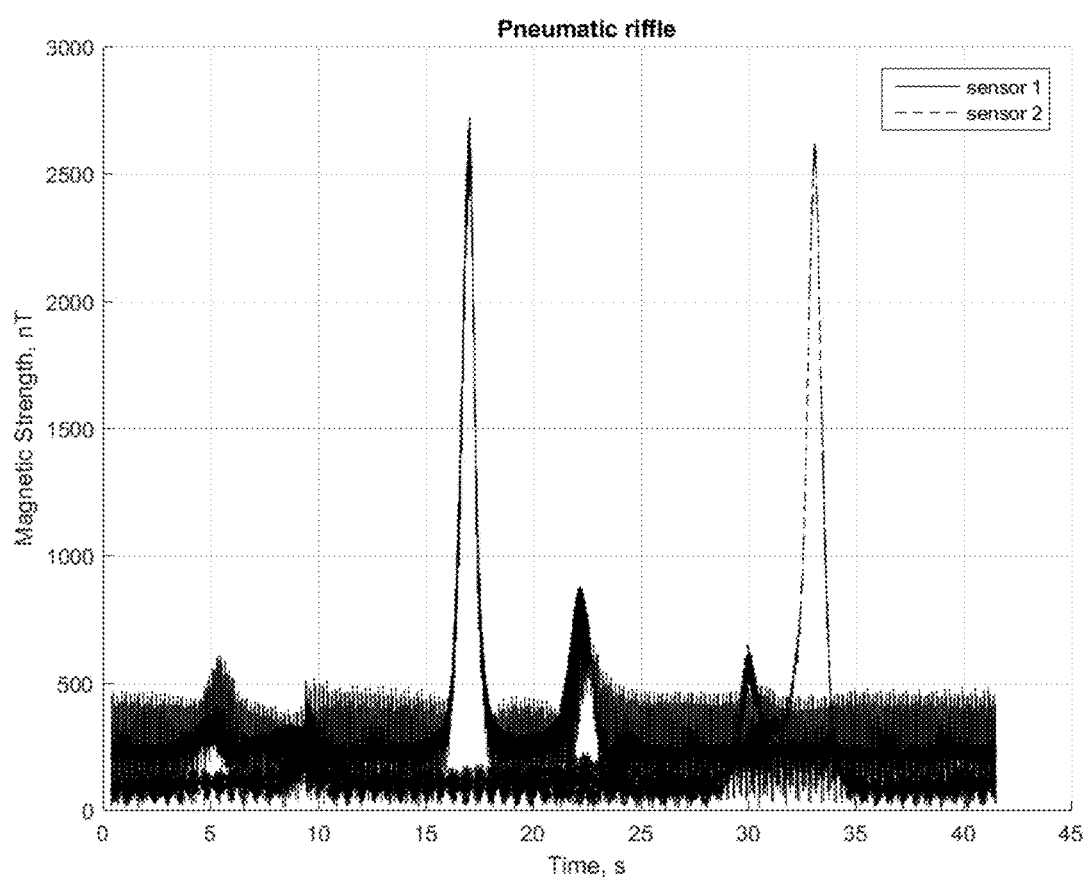
FIG. 20 shows total magnetic strength effect in nT (nano Tesla) from a person/target moving/running with a pneumatic rifle (with a 40 cm ferromagnetic barrel) attached at one of his shoulders in a vertical direction relative to the ground, with a noise effect (100 to 500 nT) (magnetometers were mounted into the portal at 1 meter above the floor) produced from the server computer and the microwave portal at switch "ON" regime.
Figure 21:
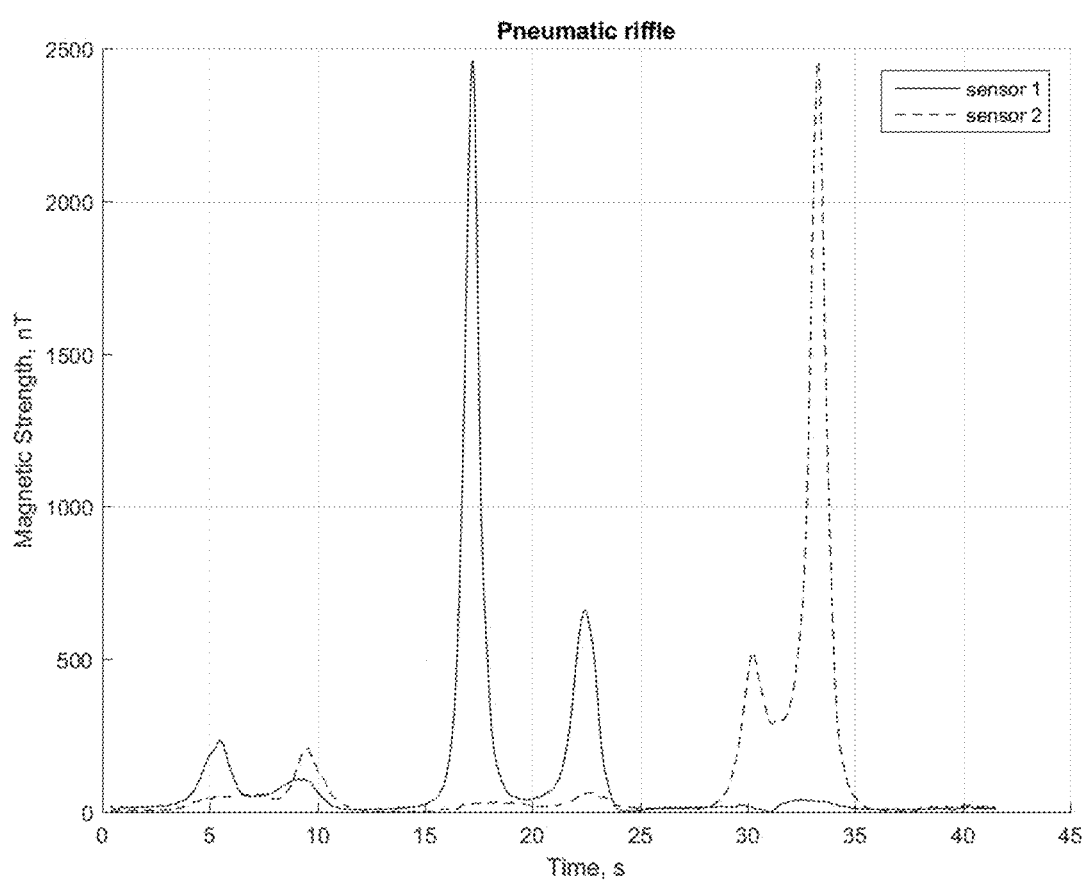
FIG. 21 shows the same effect as that in FIG. 20. but from a person/target moving/running with a pneumatic rifle with the noise cut off via frequency filtering (a useful effect is below 5-10 Hz).

Example of distributions of a path increase and the corresponding peak amplitudes for anomaly cores and peels are provided in the Drawings (see, e.g., FIGS. 14A and 14B). Each point represents a dielectric anomaly found on a person passing through the system with a large backpack, wherein the backpack may or may not contain an explosive simulant (indicated via squares, benign, and indicated via circles, simulant), or with different simulants hidden within suicide belts (indicated via diamonds).

These and other similar graphs are used to train an automatic data analysis system, which is then capable of automatic detection of dense objects with required characteristics surrounded by less dense elements in luggage. The automatic data analysis system is based on machine learning algorithms. While on every individual plot, the regions corresponding to luggage with and without threats may largely overlap, multidimensional machine learning algorithms can separate them very reliably. For example, two machine learning algorithms may be used: (1) Mahalanobis distances—a simple algorithm, in which the decision is based on the distances between the given data point and centers of clusters corresponding to different decision outcomes (metal, benign) measured with standard deviation of/from these clusters. The algorithm is chosen for its simplicity. (2) Support Vectors Machines (SVM)—kernel based algorithm, in which the decision is guaranteed to have the minimal risk of an error. This algorithm is chosen for its versatility. The final decision that the object is a particular threat is made if any of the two algorithms described above arrives at this decision (i.e., using OR logic).

Examples of images used and produced by the present invention include but are not limited to: small backpack containing a large simulant; large backpack with a simulant surrounded by clothes; suitcase with simulant and clothes carried away from the camera; suitcase with simulant and clothes carried towards the camera. The coloring/filling of the square indicates whether the detected threat is visible by the camera (filled rectangle), or part or all of it may be obstructed by the body (unfilled rectangle). For example, an open square may indicate that the threat is in a large backpack on the person's back. Thus, the security staff is able to receive a better indication about the type and location of the threat even if only one camera is used.

Block 1—3D Microwave Imaging

Block 1 makes it possible to remotely determine the dielectric permittivity of a moving, irregularly-shaped dielectric object. The dielectric permittivity of a dielectric object is determined when the object is placed against the background of a reflector. The method includes recording a 3D microwave and a 3D optical range images of an interrogated scene at the same time moment, digitizing all images and overlapping them in one common coordinate system; determining a space between the microwave and optical image (as described below), calculating a dielectric permittivity $\varepsilon$ of the space; and concluding the absence of hidden dielectric object where the dielectric permittivity is less than a threshold value. If the dielectric permittivity is in the fixed range (for example 2.9-3.1), then the conclusion is made on the presence of a hidden object.

The detection operates by sending microwaves (in centimeter range) towards a moving target (e.g., a person), and detecting the reflected waves afterwards. The data analysis is carried out in real time by high-speed GPUs to obtain the image of a potentially hidden object and receive information about its volume and dielectric properties, which allows distinguishing between a common object and a potential explosive. This information is then used to automatically assign a threat level to the found 'anomaly' without an operator's involvement.

A system for unveiling a dielectric object in an interrogated space is disclosed, wherein the interrogated space is located between an inner layer and an outer layer, comprising at least two microwave (MW) sources and at least one MW receiver forming 3D MW images of the interrogated space, wherein said 3D microwave images are formed by emitting MW signals from the MW sources towards the interrogated space, wherein each MW signal partially reflects off the outer layer (first boundary in FIG. 3) and the remainder of the MW signals travels through the intermediary space, where the reminder of the MW signals partially reflects off the inner layer (second boundary in FIG. 3), where said MW receiver receives reflected signals from said outer and inner layer, further comprising a computer/calculator which is adapted for determining at least two distances P1 and P2, between at least two sets of points, where P1=(A2−A1) and P2=(B2−B1); wherein A1 is a point of a first MW beam reflected from the outer layer, and A2 is a point of the same first MW beam reflected from the inner layer, wherein B1 is the point of a second MW beam reflected from the outer layer, and B2 is a point of the same second MW beam reflected from the inner layer (FIGS. 4a and c), wherein the at least two sets of two points are spaced from each other by a predetermined value S; and which is further adapted for calculating the difference D between P1 and P2 and comparing the difference D with a predetermined threshold value T; and further comprising an alarm adapted for indicating a likelihood of a hidden dielectric object between the inner and the outer layer, if the difference between P1 and P2 is greater than a threshold value T.

Also, a method for unveiling hidden objects in an intermediary space is disclosed, wherein the intermediary space is located between an inner layer and an outer layer, comprising sending microwave (MW) signals from MW sources towards the interrogated space, the signals being partially reflected on the outer layer and partially on the inner layer, receiving at a MW receiver a first and a second response of MW signals reflected back from the outer and the inner layer; the first and the second response signals corresponding to a first and a second 3D MW image, wherein the first 3D MW image corresponds to the outer layer of the interrogated space, and the second 3D MW image corresponds to the inner layer of the interrogated space, determining at least two distances, P1 and P2, where P1=(A2−A1) and P2=(B2−B1); where A1 is a point of a first MW beam reflecting from the outer layer and A2 is a point of the same first MW beam reflecting from the inner layer, where B1 is the point of a second MW beam reflecting from the outer layer and B2 is a point of the same second MW beam reflecting from the inner layer; wherein A1 and B1 are spaced from each other by a predetermined value S; calculating the difference D between P1 and P2, comparing the difference D with a predetermined threshold value T; indicating if the difference D is greater than the threshold value T. In one embodiment, the method further comprises determining at least a third and a fourth distance P3 and P4 from a third and a fourth response signal, where P3=(C2−C1) and P4=(D2−D1), where C1 is the point of a third MW beam reflecting from the outer layer and C2 is a point of the same third beam reflecting from the inner layer, where D1 is a point of the fourth MW beam reflecting from the outer layer, and D2 is a point of the same fourth MW beam reflecting from the inner layer. P3 and P4 can be used to increase reliability of an alarm triggered when the difference D between P1 and P2 is greater than the threshold value T. P3 and P4 can be determined in essentially the same area where P1 and P2 are determined, but using different viewing angles. P3 and P4 can also be used to detect further hidden objects in a different area than where P1 and P2 are determined.

The interrogated space can be between the body of a person and the clothing of this person or between two layers of clothing of a person. The outer layer is preferably formed by the boundary between air and the outer clothing of a person.

Figure 3:
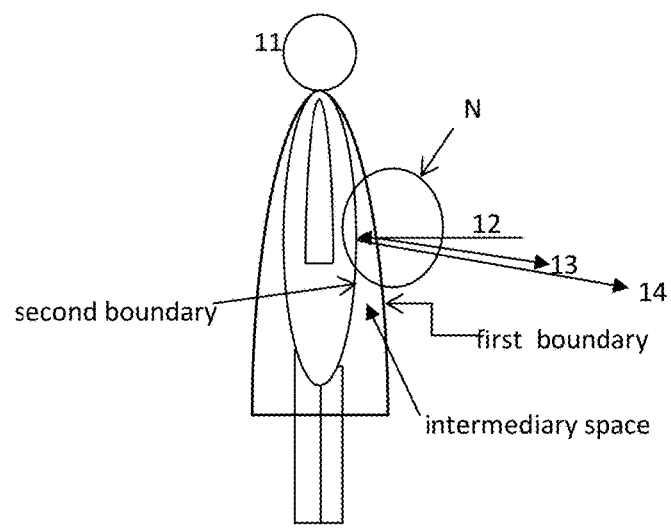
FIG. 3 shows the microwave path and reflection off a target's coat and body boundaries (first and second boundaries, respectively).
Figure 4:
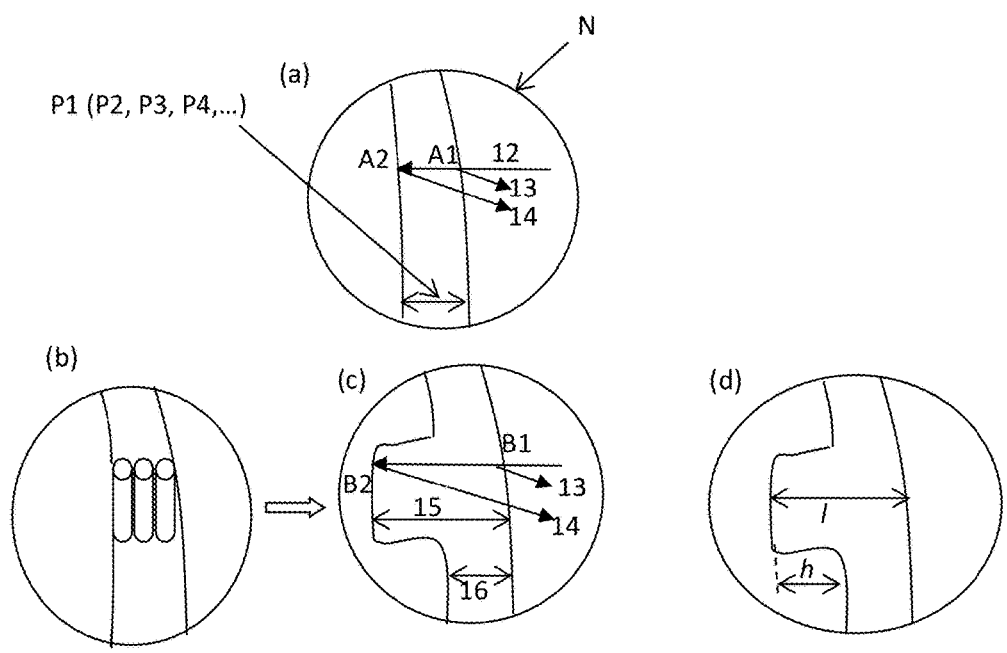
FIG. 4 further details a microwave (MW) beam's reflection in (a) the absence, and (b), (c), (d) the presence of hidden dangerous objects.

3D Microwave Imaging Techniques. Determining the presence of a potentially hazardous object carried by a target 11 is done in the following manner (FIG. 3). Some of the primary emitted MW radiation 12 is partially reflected by the first (outer) boundary (usually the person's coat/jacket/outer garment) forming a reflected beam 13 (see FIG. 4(a)—an enlarged view of area N—for greater detail). The same radiation/wave then travels through the coat until reflected by the second (inner) boundary, the human body, forming a second reflected beam 14. Thus, at least two reflections of the same wave occur—one reflection occurs at the outer boundary of the target and/or object (i.e. the first border, or air/intermediary space border) and another reflection occurs after the wave travels through the intermediary space and reflects off the target's body (i.e. the opposite side of the hidden dielectric object, if present). The measured distance P1 of the intermediary space between the first and second boundaries is recorded and used to detect the presence of hidden objects, P1=(A2−A1) is the distance between the point A2 on the second boundary and corresponding point A1 on the first boundary. This process is repeated for measuring of at least one other distance or continuously for measuring of other distances, allowing microwave beams to hit and reflect off of various locations along the first and second boundaries. Each additional microwave beam that reflects off additional locations along the first and second boundaries B1, C1, D1, . . . and B2, C2, D2, . . . allows for measurement of additional distances P2, P3, P4, . . . between first and second boundaries. With microwave signals being emitted and received continuously, 3D microwave images of the inspected area are created. The first 3D MW image corresponds to the first boundary, and the second 3D MW image corresponds to the second boundary. The method allows determining the presence of hidden dielectric objects on the human body under the outer garment or carried by the person. Area N is enlarged and shown in greater detail in FIG. 4(a). FIG. 4(a) represents a situation without a hidden object. FIG. 4(b) illustrates how an explosive might be worn on the body under a coat. In a preferred embodiment of the present invention, the hidden objects are explosive materials of components thereof. In one embodiment the method of the present invention is used to unveil hidden suicide bombs in a crowd of moving people. The dielectric constant of explosives is about three or larger. The MW radiation traveling through a medium with such a high dielectric constant is equivalent to traveling a longer distance in air and thus the microwave image of a hidden object is portrayed as a cavity protruding into the body, as illustrated by FIG. 4(c). This seemingly longer distance corresponds to a sharp change of the microwave beam path length, which is detected by the receivers because the MW beam in a first area 15 contains extra path gain compared to the MW beam in a second area 16. By measuring the phase and amplitude of incoming reflected microwaves, the microwave path (i.e. the path of the microwave beam/signal) can be determined and the sudden sharp change of the path in certain areas, if present, is registered. Because a microwave travels more slowly in an object with a higher dielectric (permittivity) constant, a second border signal takes longer to arrive in the presence or area of an object (compared to areas where no object is present, e.g., just above, below, or to either side of an object.). If the change in path value exceeds a preset threshold value, it serves as an indication that a hidden object is present.

In the preferred embodiment, the threshold value T is system resolution in depth in the direction perpendicular to the first and the second boundaries (i.e. the outer and inner layers, also called borders). In the preferred embodiment the resolution is equal to 1 cm. The resolution depends on the bandwidth of the MW frequencies used. The resolution is equal to the speed of light in vacuum divided by the doubled bandwidth of the MW frequencies used. Bandwidth of the MW frequencies is typical 15 GHz, which thus means 1 cm resolution in depth.

The additional path, h (see FIG. 4(d)), is equal to h=l(( )), where l is the thickness of the intermediary space, which equals the distance from the first boundary to the second boundary including the cavity, if present, as shown by the first area 15 (see FIG. 4(c)), and ε is the dielectric (permittivity) constant of the intermediate space. The additional path, h, is calculated by subtracting the measured value of the second area 16 from the measured value of the first area 15. 15. 15. 15. 15.

The first and the second border signals can be used to reconstruct two 3D MW images of a person, one corresponding to the outer garment and the other corresponding to the human body, as described above. However, the signal received from the first border of an interrogated space, due to its small value, may be disrupted by the side lobes (i.e. secondary maximums) of the signal from the second border. Preferably, a synchronized video image border can additionally be used, if the signal/noise ratio is low (see FIG. 2).

MW radiation can be emitted from various different angles and the reflected radiation, also travelling from various different angles, is similarly processed, allowing for accumulation of additional data to improve the accuracy and resolution of the image and detection process. Various configurations of setups are possible.

Block 2—Co-Polarization vs. Cross-Polarization Processing.

The purpose of Block 2 is to detect hidden metal weapon and metallic shrapnel. When the present invention is used to detect an object like a handgun, the detection is more easily accomplished when the handgun is oriented in a way that presents a relatively larger radar cross section to the detector. For example, a gun that is tucked behind a person's belt buckle so that the side of the gun is flat against the waist presents a larger radar cross section than a weapon holstered on the hip with the gun barrel pointing toward the ground and the grip pointing forward or back. In general, the present invention relies on the physical phenomenon of reflection in which an incident beam of horizontal polarization will be partially reflected back as vertical polarization. The percentage of energy converted to vertical polarization depends on the shape of the weapon in the plane normal to the direction of incidence and sharpness (contrary to flat parts) of different parts of weapon (or shrapnel). If the weapon has a cross sectional shape that has both vertical and horizontal components, then a vertically polarized component will be realized even though the object is irradiated by horizontal polarization.

Measuring the phase of the polarized waves reflected from a person who may be carrying a concealed weapon is important because the polarized waves reflected from a concealed weapon and the polarized waves reflected from a human body behave quite differently. In general, the reflections from a concealed weapon, while not constant, vary within a relatively confined range. In contrast, the reflections from a human body are chaotic. A preferred embodiment of the invention exploits this generalized phenomena by using signal processing methods to distinguish the relatively well-behaved signals from a concealed weapon from the generally unpredictable signals from a human body.

Figure 2:
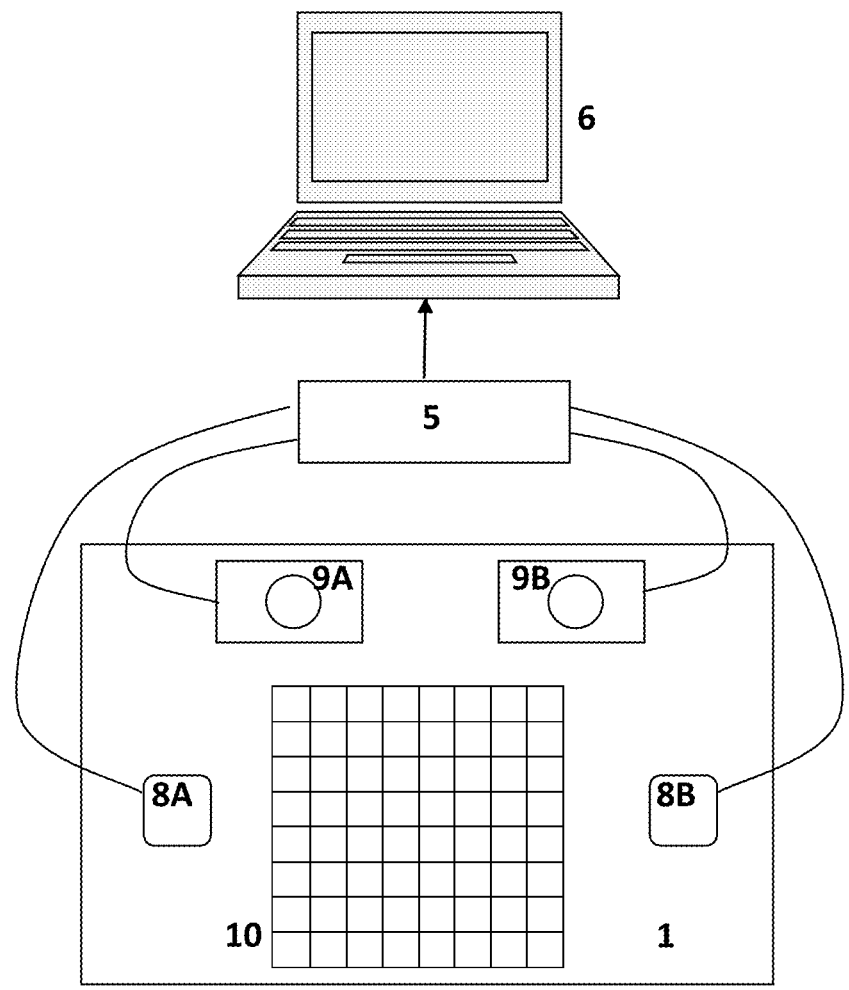
FIG. 2 shows a detailed schematic of a threat detection block comprising an active microwave detection system.
Figure 5:
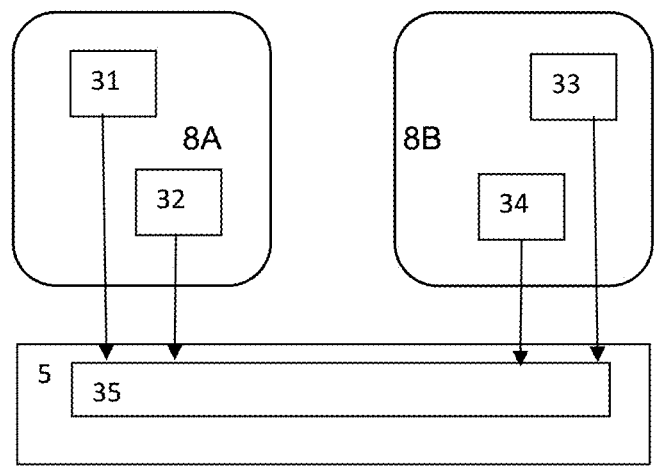
FIG. 5 shows detectors in the cross-polarization method of the present invention.
Figure 6:
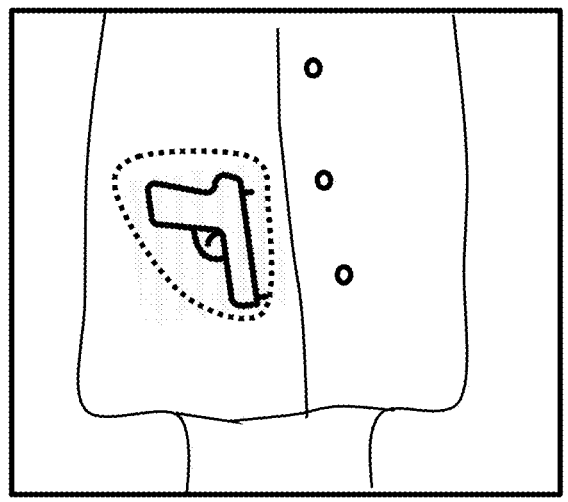
FIG. 6 is a schematic image of a real hidden metal threat (gun) and the detection of said hidden metal threat obtained via the cross-polarization method of the present invention.
Figure 7:
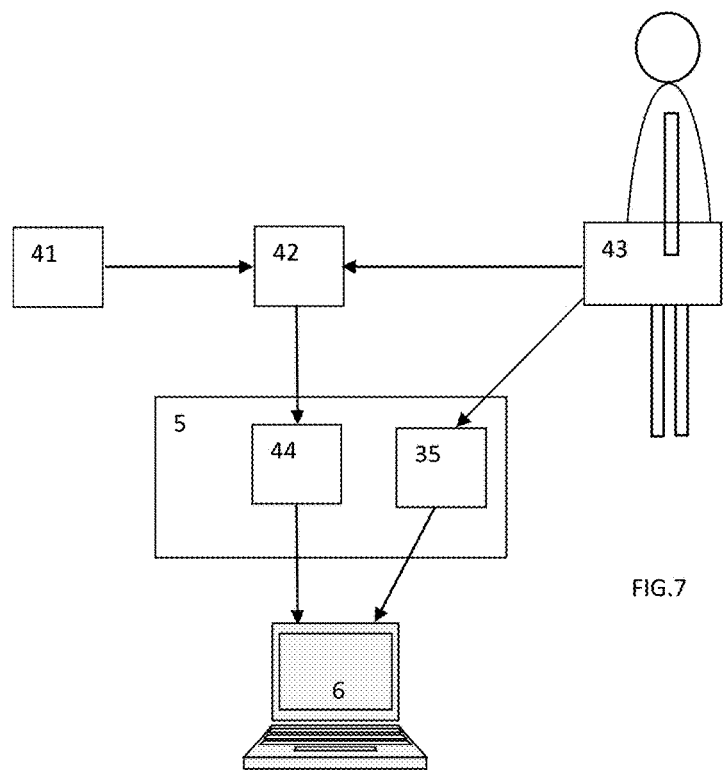
FIG. 7 is a schematic block diagram of the nuclear material detection block.
Figure 8:
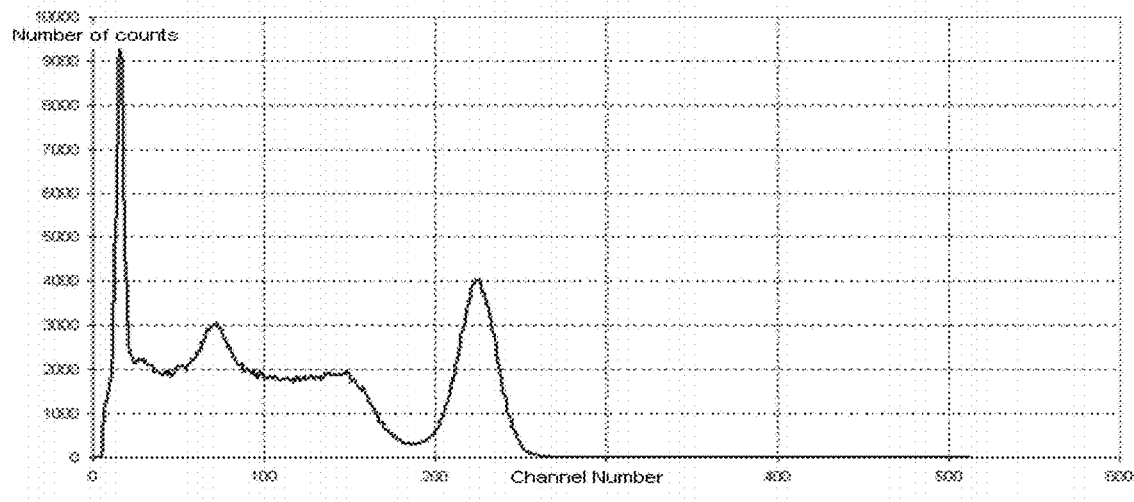
FIG. 8 shows a spectrum of cesium-137 obtained by sodium iodide (NaI) detector (prior art).

The present invention incorporates the apparatus depicted in FIG. 2 to measure amplitude and phase of the returned cross-pole signal. Microwave receivers 8A and 8B include two detectors each as shown in FIG. 5. Detectors 31 and 32 register received microwave radiation with vertical polarization and detectors 32 and 34—with horizontal polarization. In one embodiment this is achieved by placing corresponding polarization filters in front of the receivers. Data from the detectors 31-34 enters processing component 35, which is a part of the processing unit 5.

The present invention reconstructs a 3D MW image and compares amplitudes of reflected co- and cross-polarization waves in many places/zones of the human body simultaneously and in real time. This allows for detection of concealed weapons, shrapnel, or other items without comparison to pre-stored reference data. In an alternative embodiment of the invention the present invention takes reading of multiple individuals and automatically determines the presence of hidden weapons, shrapnel, or other items simultaneously.

The cross-polarization method partially uses the same equipment (microwave detectors, processing unit, computer, alarm system) as previously described 3D microwave imaging (Block 1) for detection of hidden plastic explosives.

Expected Performance of System with Co-Polarization and Cross-Polarization Technologies. Threat objects detected by such techniques include automatic weapons and metallic shrapnel. The area of detection includes mainly the chest/front area of a subject body. The stand-off detection distance threshold is 3-4 meters for automatic weapons. The threat localization is to within 0.2 meters. The shielding problem in a crowd (e.g., shadowing of one body behind another is an issue for this type of detection technology).

Block 3—Passive Magnetometry

Due in part to the desire of end users to add more reliable automatic weapon detection capabilities to the present invention, an additional block comprising passive magnetometry technology is further included. While co/cross polarization technology, as described above in reference to Block 2, is expected to perform some sort of automatic weapons detection and metallic shrapnel on the surface of IED (improvised explosive device), that technology has numerous limitations, including but not limited to the following: (1) the front area of a subject body (i.e., mainly the chest area) is considered; (2) shadowing is a problem (i.e., one subject body being blocked by another subject body or more); (3) FAR (false alarm rate) to other body parts/areas (e.g., gender and shoulder areas); (4) low performance to flat metallic surfaces (e.g., a weapon attached/placed against a subject body, at a near zero angle); and (5) FAR to benign metal goods with sharp edges.

Passive magnetometry techniques, as described hereinbelow, solve the limitations noted above with regard to cross/co-polarization technology and may be added as low cost solutions to the limitations of current state of the art security systems and methods.

Magnetometers may be coupled with co- and cross-polarization techniques, as described above, in order to further assist in differentiation amongst types of automatic weapons as well as the general type of metal threat. Magnetometer have several advantages over conventional metal detectors, including but not limited to: (1) higher in safety, due to the fact that magnetometers do not emit anything; (2) no screening preparation necessary (e.g., no removal of jewelry, phone, wallet, etc.); (3) throughput speed is 4-5 times faster than conventional metal detectors (magnetometer screening devices can screen about 1000 targets or more per hour); (4) no calibration necessary (due to the earth's magnetic field being everywhere, there is no need to calibrate and makes magnetometers very portable); and (5) no secondary screening necessary (e.g., no need for a full body cavity search in any situation).

Examples of particular magnetometers which may be used are as follows: (1) Bartington (single axis fluxgate Mag670 or three-axis fluxgate Mag690); (2) Metrasense, Cellsense Plus (it is noted with regard to this type of magnetometer, that this type also detects knives, tattoo guns, lighters, and firearms; it is also noted that with regard to this type of magnetometer, that two Cellsense units may be positioned in parallel and at a distance to create a portal operation, the portal being up to 2.5 meters in width, in order to provide detection of ferromagnetic metal from distance above 1 meter).

Experiments performed show that most weapons are visible using the magnetometer technique within 2 meters or less from a magnetometer sensor. Larger weapons result in greater significant changes; however, more modern (i.e.

smaller or using less metal) weapons result in a smaller signature at distances greater than 2 meters. One such experiment is described in detail below:

Magnetometer Experimental Results. Two Three-Axis Fluxgate Magnetometers (Bartington, Mag690) are connected to SPECTRAMAG-6 Data Acquisition Module via a 5 meter cable. The SPECTRAMAG-6 is connected to a processor (e.g., computer, PC) for digital data collection from the magnetometers. The entire setup is also coupled to the cross- and co-polarization technology of the present invention, such that the two technologies work in parallel. The two magnetometers are positioned at 2.4 meters away from each other to create a portal, on the portal's frame comprising co- and cross-polarization technology, at 100 cm from the floor. Objects tested included the following threat objects and its imitators: pneumatic rifle, pneumatic gun, ferro barrels (10, 40 cm long), fire extinguisher (1 liter, 4 liters), and vax with nuts. Objects tested included the following benign metal objects: notebook (in rucksack), mobile phones, keys/money, zipper/belts, drill (in rucksack). Tests were performed comprising 1 person, 2 persons, and 3 persons simultaneously inside the inspection area of the portal, each at varying distances (e.g., middle—120 cm approx. from both magnetometers, left—60 cm approx. from magnetometer #1 (sensor #1 on FIG. 15 for example) and 180 cm from magnetometer #2 (sensor #2 on FIG. 15 for example)., right—60 cm approx. from magnetometer #2 and 180 cm from magnetometer #1 within the portal created by the two magnetometers). The test results are shown in FIGS. 15-21. In summary, the results of the experiment described above were as follows (see also Brief Description of FIGS. 15-21, which further explains the figures and results shown therein):

Effect. (1) Pneumatic rifle (with 40 cm ferromagnetic barrel): Visible effect in 250 to 2,000 nanoTesla (nT) (at a distance from the magnetometer between 1.2 and 0.6 meters, respectively) from a pneumatic rifle (see FIG. 15) with a clean background, 2-6 nT when the same person crosses the portal line (at a distance from the magnetometer between 1.2 and 0.6 meters, respectively) without ferro-metallic objects (see FIG. 16). (2) Pneumatic pistol (with 10 cm ferromagnetic barrel): Visible effect at 15 to 120 nT (at a distance from the magnetometer between 1.2 and 0.6 meters) from a pneumatic pistol (see FIG. 17) with a clean background, 2-6 nT (see FIG. 16) (3) The visible effect at 15 to 120 nT (at a distance from the magnetometer between 1.2 and 0.6 meters) of a laptop in a backpack (see FIG. 18) is comparable in modulus with the effect of the pneumatic gun (with 10 cm long barrel), but it has different responses from the pistol along the three axes of the magnetometer. Total magnetic strength effect (presented on FIG. 15-21) means modulus of vector calculated from three axis' of magnetometer values in X, Y and Z directions. (4) The effect 2-30 nT of a safe ferro-iron (e.g., phone, keys, coins, etc.) is slightly above the background level (see FIG. 19). (5) Noise effect (magnetometers were mounted into the portal at 1 meter above the floor): High-frequency noise (100 to 500 nT) from the server computer and the microwave portal (see FIG. 20) can be cut off via frequency filtering (a useful effect is below 5-10 Hz) (see FIG. 21).

Localization. When two or more people pass through a transmission portal zone simultaneously, localization of a suspicious person can occur via a comparison of the effect modules from the left and right magnetometers and a synchronous photo from a camera.

Expected Performance of System with Passive Magnetometers. Threat objects detected by passive magnetometry include automatic weapons, guns, and large knives. The area of detection includes the entire body (e.g., front, back, legs, hands, inner body). The stand-off detection distance is 2 meters for automatic weapons, and 1-2 meters for smaller guns. The threat localization distance is 0.5 meters. There is no shielding problem in a crowd (e.g., shadowing, transmitting signals through groups of people to detect a threat behind a benign subject)

Block 4—Facial Recognition

Block 4 (optional) provides face recognition based on comparing the face image obtained by cameras 9A and 9B (also used in Block 1) with a database of known suspicious people. Any know technique can be used for the data processing. For example, U.S. Pat. No. 6,301,370 discloses an image processing technique based on model graphs and bunch graphs that efficiently represent image features as jets. The jets are composed of wavelet transforms and are processed at nodes or landmark locations on an image corresponding to readily identifiable features.

Simultaneous 3D Video and MW Imaging. Additionally, a 3D video image of the target may be recorded at the same time of a MW image. In this preferred embodiment, the method of the invention thus further comprises forming a 3D optical image of the outer layer of the interrogated space, synchronizing the 3D optical image with the location of the points A1, B1 and optionally C1 and D1, determining points A1', B1' and optionally C1' and D1' on the 3D optical image corresponding to the points A1, B1 and optionally C1 and D1, calculating the differences $P1'=(A2-A1')$, $P2'=(B2-B1')$ and optionally $P3'=(C2-C1')$ and $P4'=(D2-D1')$ and comparing the values P1 with P1', P2 with P2' and optionally P3 with P3' and P4 with P4'. Similarly, in the invention a system as described before is preferred which further comprises at least two cameras recording optical images of the interrogated space and being adapted for forming a 3D optical image of the interrogated space; and a computer which is adapted for synchronizing in time and superimposition and digital space of the 3D optical image with the 3D MW image formed by the at least two microwave sources and at least one microwave receiver of the interrogated space, which is reflected from the outer layer. The reflection signal from the outer layer (points A1 and B1) may be few times weaker compared to the reflected signal from the inner layer (points A2 and B2). Points (A1', B1') from the outer layer extracted from a 3D optical image of the outer layer of the interrogated space (delivered by stereo cameras) can be used to calculate P1' and P2' and compare with P1 and P2.

Preferably, more than 100 microwave sources are used in the method of the present invention. It is also preferable to use microwave sources which have a spectrum comprising multiple frequencies.

Preferably, at least two video cameras 9A and 9B (see FIG. 2) record images of the target, and the DSP unit 5 reconstructs a 3D video image of the object. Optical beams do not penetrate the outer boundary (i.e., the person's outer garment in the example herein). This 3D video imaging is synchronized in time with the 3D microwave imaging. Overlapping the 3D video image over the 3D MW image of the outer border can achieve improved accuracy of the position of the outer border and improved calculation of the additional path, h. In one embodiment, the system is additionally equipped with an automatic alarm, which triggers a sound or a visual alert if the distance h is above a predetermined threshold value and thus the presence of a hidden object(s) is suspected.

In one embodiment the 3D microwave image is formed by illumination of the scene by microwave radiation from one emitter and recording the scene image by at least two microwave detectors. In another embodiment the illumination is performed by at least two separate microwave emitters that illuminate the scene from different angles, and the recording is performed by one microwave detector.

In one embodiment the microwave emitter radiation is a coherent microwave radiation at N frequencies, which optionally can be equi-frequencies, are not related to the lines of absorption of the irradiated media.

The 3D optical image is formed by illumination of the scene by optical radiation and recording the scene image by at least two optical detectors. Different types of processing may apply. In the preferred embodiment, a digital signal processor (DSP) performs a coherent processing, which calculates the 3D image taking into account both amplitude and phase information of electromagnetic fields reflected from the interrogated scene.

Parallel Data Processing Occurring on One or More Computer Processors. The combinatorial processing of data collected by Blocks 1, 2, and/or 3 is unique and advantageous. Such parallel and combined processing provides simultaneous collection and analysis of various data from combined threat detection techniques in real time for check points in public places such as airports, subway, etc. By processing such data in parallel, rather that separately, the processing time is greatly reduced, allowing for higher traffic flow without losing efficiency or quality of the threat detection, and in some embodiments, further improving the same while also allowing for higher traffic flow through the system.

Wide Angle of Inspection. The present invention is capable of achieving a wide angle of inspection, i.e. greater than 90 degrees perspective of an inspected area. This wide angle is achieved by an antenna design (emitters, Tx, and receivers, Rx) having a wide directionality range (more than 90 degrees). Tx and Rx antennas are designed as directional antennas with a wide antenna pattern with a main lobe more than 90 degrees at 3 dB beamwidth. See FIGS. 9-11.

Figure 9:
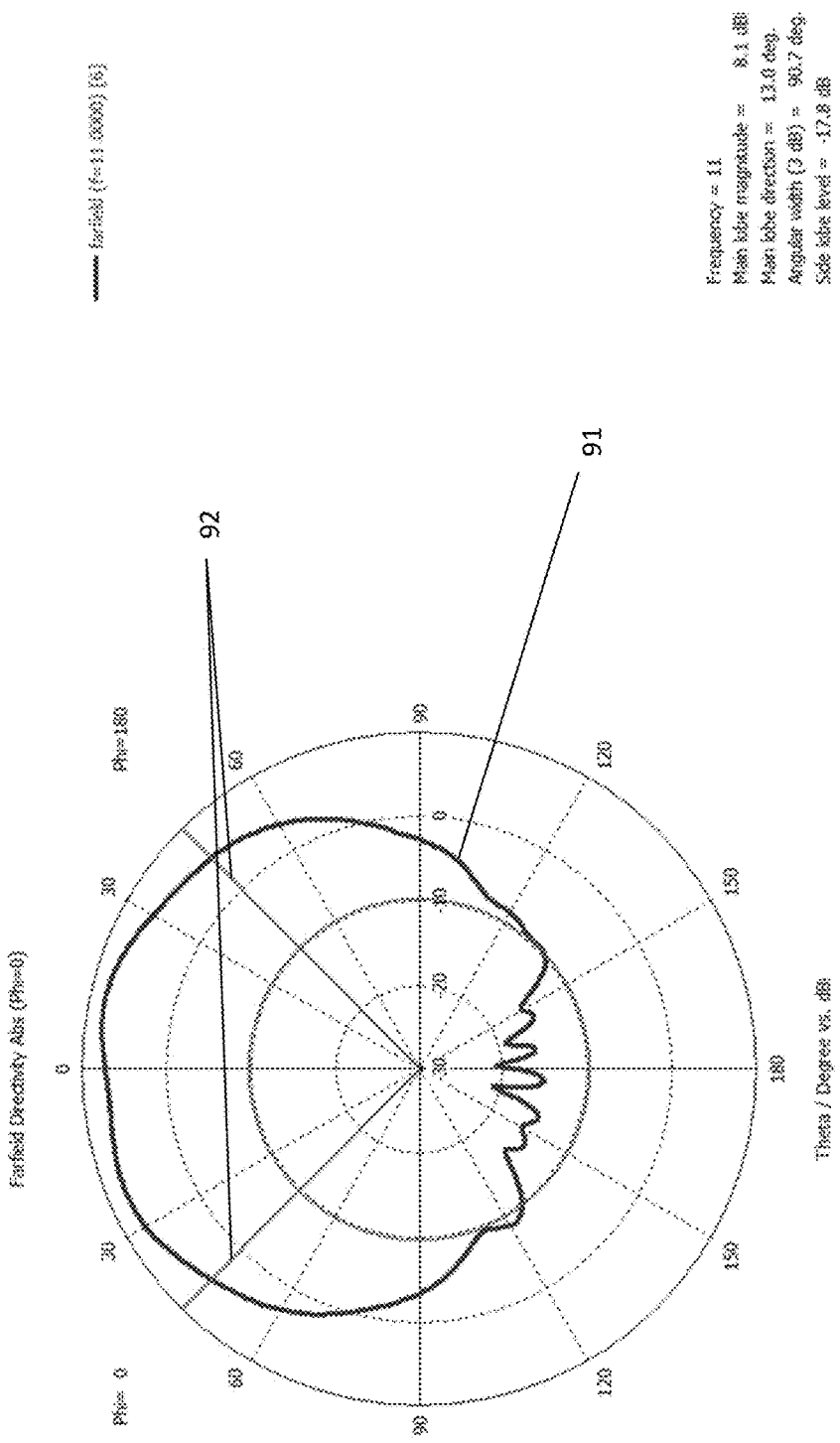
FIG. 9 shows a graphical example of transmitters with a wide-angle radiation pattern 91 in polar coordinates, at a frequency of 11 GHz. The main lobe is 90.7 degrees at 3 dB beamwidth 92.
Figure 10:
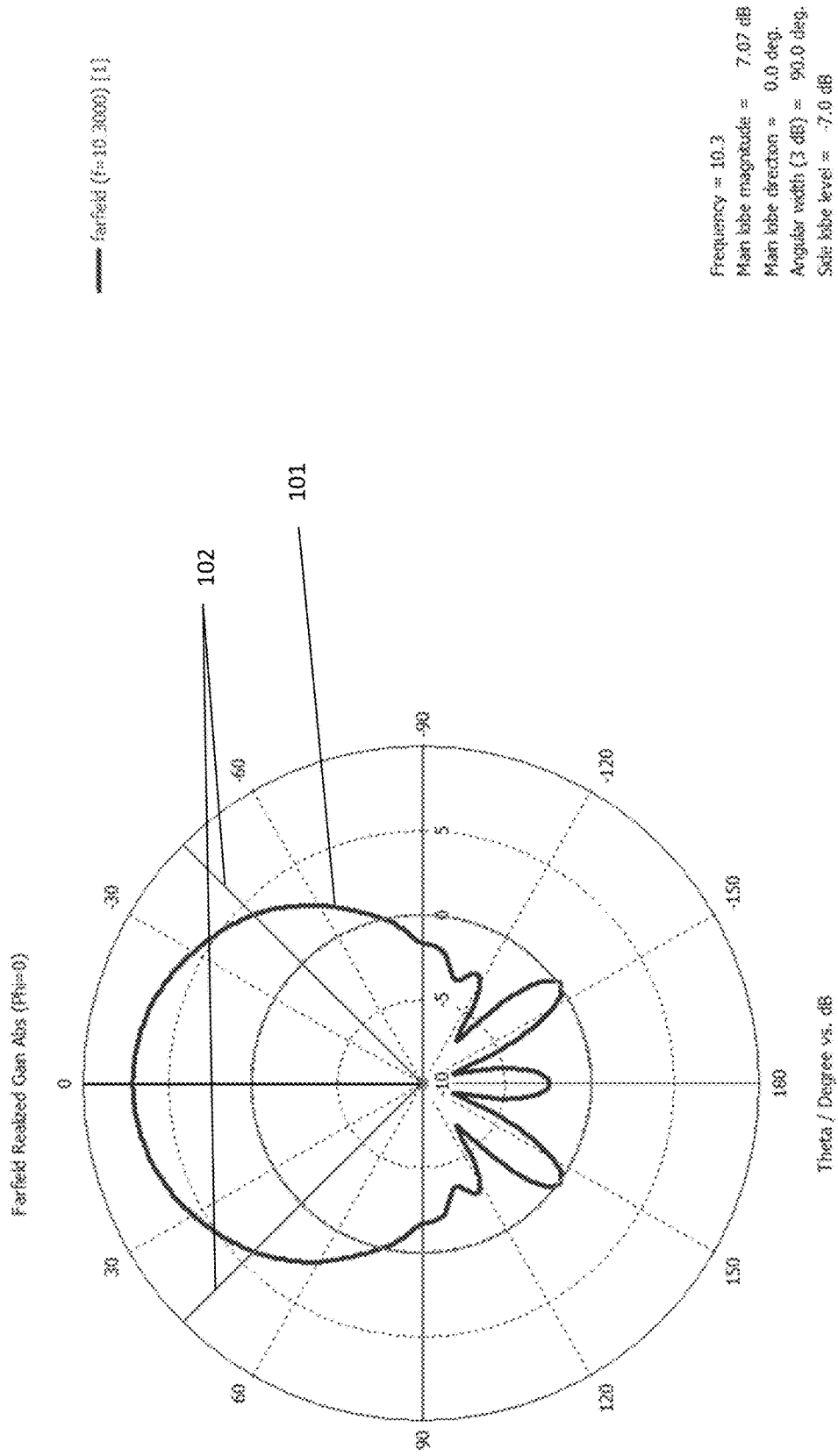
FIG. 10 shows a graphical example of receivers with a wide-angle radiation pattern 101 in polar coordinates, at a frequency of 10 GHz. The main lobe is 90 degrees at 3 dB beamwidth 102.
Figure 11:
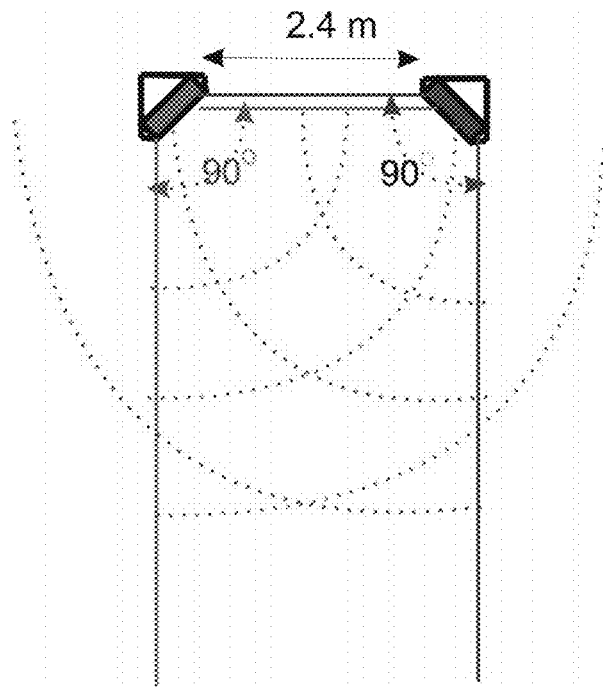
FIG. 11 shows an example illustration of a wide angle of inspection greater than 90 degrees of an inspected area (transmitters and receivers are located on each of the left and right pillars).
Figure 12:
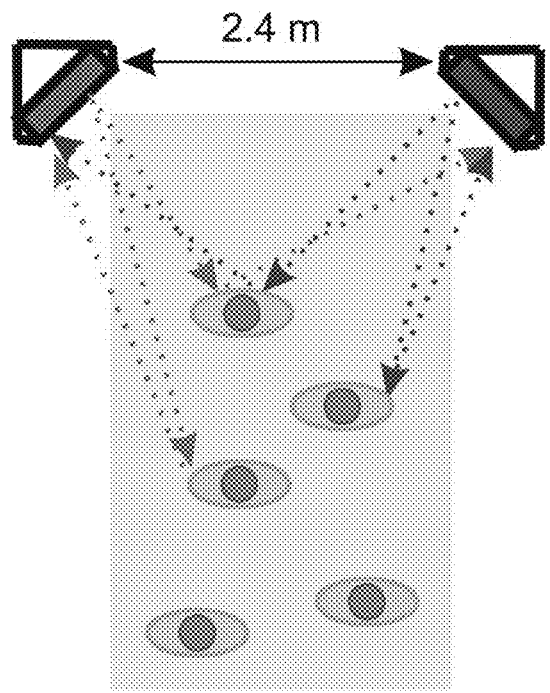
FIG. 12 shows an example illustration of a wide zone of inspection and operating pillars as a single system and as a complex system. A single system according to the present invention comprises means for transmitting and receiving wherein both means are located on one pillar or block. A complex system according to the present invention comprise means for transmitting and receiving wherein the transmitting means and receiving means are located on two or more separate pillars which may further correspond with each other.

Wide Zone of Inspection. The present invention achieves a wide zone of inspection. The wide zone of inspection is achieved by the following features: (1) a wide distance between pillars comprising microwave emitters/receivers (e.g., 2.4 meters between pillars); (2) each pillar is capable of operating as a single system (i.e., transmitters and receivers in one pillar) and also in combination as a complex system of pillars (i.e., at least two pillars, each with transmitters and/or receivers which may correspond with one another); and (3) inspection of targets from varying angles due to the geometry/setup of the pillars and cameras. See FIG. 12. FIGS. 9 and 10 further show Tx and Rx antennas which each individually have a greater than 90-degree lobe. FIG. 11 then shows an exemplary wide angle of inspection in a chosen geometry of pillars and FIG. 12 shows a wide zone of inspection, defined by Tx and Rx antennas having wide angles, a wide distance between pillars (e.g., 2.4 meters), and a capability of Tx and Rx antennas being located on the same pillar(s) (i.e., a simple, or independent, system) or a capability of Tx antennas being located on one pillar (e.g., left) and Rx antennas being located on another pillar (e.g., right), or vise-versa (i.e., a complex system). Such a setup allows for an inspection of targets from varying angles at the same time.

Digital Focusing. The present invention is capable of achieving a digital focusing, rather than a mechanical scanning of the target area and subject(s). The digital focusing is achieved via coherent processing of the signals received (i.e., including both phase and magnitude/amplitude data simultaneously). In the prior art, such digital focusing is impossible or at least limited by computing resources for moving targets in wide inspection zones. For example, current prior art system data scans take a period of tens of milliseconds, but the data processing and analysis of the same scan takes a period of at least a few seconds. The present invention, however, is capable of performing both the scanning and the processing in real time (i.e., total scanning and processing occurs preferably in less than 50 milliseconds, or 50-60 milliseconds, depending of numbers of targets simultaneously investigated in the inspection zone. Scanning and processing occurs in parallel processors (i.e., the scanning and processing occurs simultaneously).

The digital focusing and real time processing discussed above allow for a high throughput without impeding the flow of targets through the inspection area, a feature which is required in mass transit hubs. The real-time operation is a result of, and includes without limitation, the following features: (1) fast switching of a frequency inside of a specially designed wideband frequency generator (a typical time for such fast switching, alongside a good frequency stability, is in the range of a few, e.g., 4-6, microseconds) 131; (2) fast switching of individual antennas within an array by specially designed multilayer electronic boards coupled with multiple output fast keys (a typical time for such fast switching is in the range of tens of nanoseconds, e.g., 50-100 nanoseconds). It is further noted that the fast keys are switched based on an input signal to one of a set of outputs by command (e.g., four outputs). Four such keys are designed in a multiplexer (i.e., one input to one of 16 outputs by command). Each fast key (e.g., single microchip) thus has one input and four outputs. The boards for one antenna array may thus be 256 individual transmitters, which contains 64 fast keys to deliver one base signal, in each frequency, to the individual transmitters in real time; (3) an algorithm designed to process the signals received as a result of the fast switching described above, the algorithm being programmed on a microchip located on an electronic board and controlled by main processor located within the pillars according to the present invention. See FIG. 13.

Figure 13:
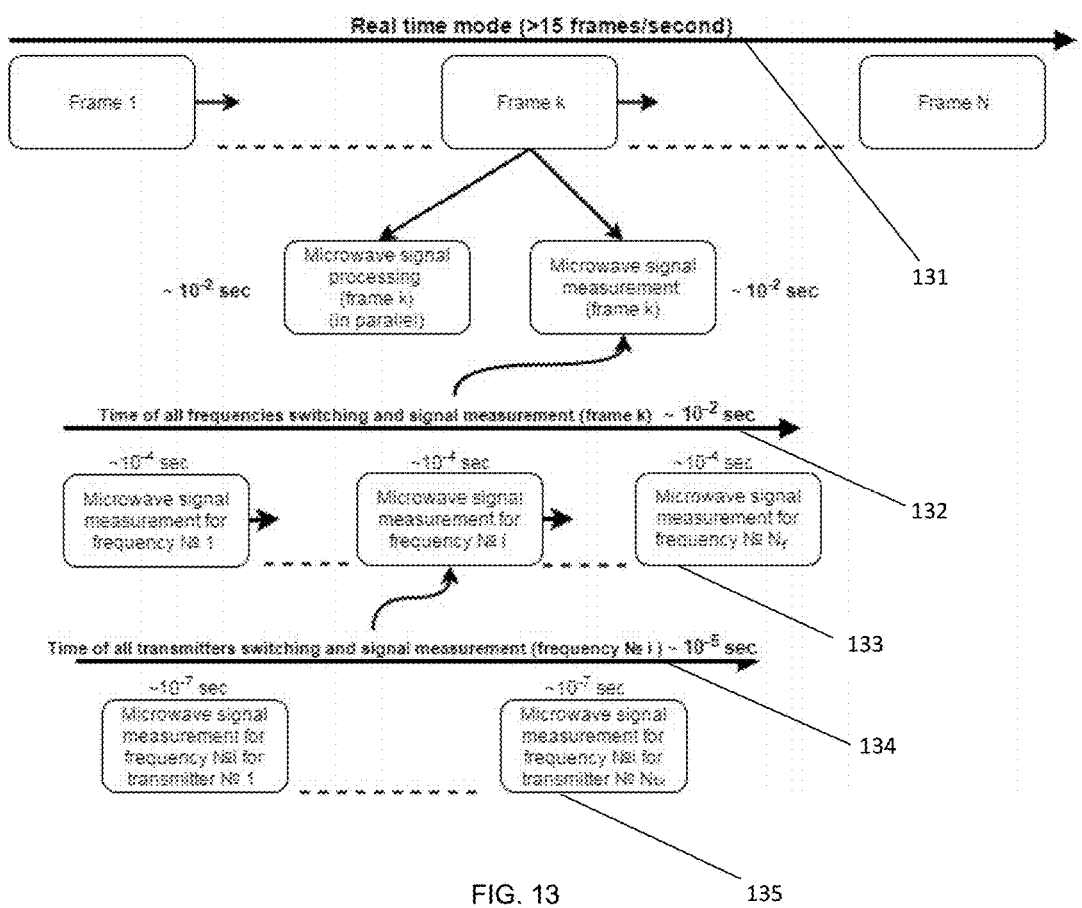
FIG. 13 shows an example flowchart illustration of the real-time processing (greater than 15 frames per second) of signals received and the fast switching, according to the present invention.

Discussing FIG. 13 further: One frame of processing may be broken down as shown in the figure. Moving from the bottom of FIG. 13 upwards, 135 represents the order of time necessary to measure a reflected signal from one transmitter (Tx) at one frequency (this occurs on the order of $10^{-7}$ seconds), for example, 800 nanoseconds; 134 represents the total time of all transmitter switching and signal measurements of all transmitters at one frequency (this occurs on the order of $10^{-5}$ seconds, as several microwave signals are measured); 133 represents the order of time necessary to measure reflected signals from all transmitters at one frequency (this occurs on the order of $10^{-4}$ seconds); 132 represents the total time for all transmitter switching at all frequencies combined and signal measurements of all transmitters at all frequencies combined (this occurs on the order of $10^{-2}$ seconds); 131 represents the number of frames per second (e.g., 15 fps) produced via a microwave signal measurement in one frame and within time period of about 50-60 milliseconds.

Real-Time Processing of Signals Received. An important parameter for determining the quality and efficiency of multi-threat detection is the time in which it takes to collect one frame of data. A typical time for collecting one frame is about tens of milliseconds, which includes all targets in a wide zone with fast frequency switching (typically more than hundred frequencies) and with fast switching of individual antennas in the array (typically, more than one thousand individual transmitters/receivers in up to four antenna arrays). The present invention is capable of capturing 15 or more frames per second of all detected targets within the inspection zone simultaneously (i.e. one frame is collected in about 50 milliseconds, processing of the same frame takes also about 50 milliseconds in parallel to the collection time; therefore, the two values determine a value of 15 frames per second, or more if one of the two values is further shortened). To put this value of 15 frames or more per second into perspective, the following examples are provided:

EXAMPLE 1

With a speed of 15 frames per second (fps), and a person moving approximately 10 cm per frame, the system of the present invention captures targets without losing processed information before the subject moves too far. If the speed decreases by 5 fps, the system would lose a tracked target because that target will have shifted 30 cm and may already cross into a neighboring trajectory channel of waves. Thus, a higher fps allows for such real-time processing while also providing the capability of processing several targets at once. In general, the more frames per second, the greater the performance and probability of detection, since all frames are used in the analysis independently and in combination contribute to any final alarm decision. Current prior art in the field of invention is limited to a maximum of 15 fps or to non-moving targets, or both. The present invention operates at greater than 15 fps and applies to both moving and non-moving targets at the same rate of 15 fps or more.

Standoff Detection at Longer Distances. The present invention is capable of inspecting an area as long and wide as 3 meters (or less), and/or an area as long as 6 meters (or less). The size of a given embodiment and inspection area may depend on specific factors such as, but not limited to, visibility zone of video, visibility zone of microwave imaging, and system resolution requirements.

Multi-threat Detection of Explosives and Metallic Weapons Simultaneously. Multi-threat detection of both explosives and metallic weapons, at the same time, and in real time, is achieved by the following aspects of the present invention: (1) each transmitter uses the same source of microwave irradiation; (2) various scattered polarization is detected by the same receiving antenna but turned 90 degrees (i.e., the same design receiving antenna turned 90 degrees about its axis of symmetry, such that the antenna receives cross-polarizations of transmitted signals); (3) a receiving antenna placed at 0 degrees, in relation to (2), for collecting initial polarization of transmitted and scattered signals (i.e., for receiving co-polarizations); (4) A calculated ratio of co-polarizations and cross-polarizations (collected preferably as described herein, i.e., antennas placed at "0" and "90" degrees) allows for detection of separate explosives threats and metallic object threats (see, e.g., FIGS. 14A-14B); and (5) a unique algorithm for separately reconstructing two 3D microwave images, one with regard to co-polarizations received and the other with regard to cross-polarizations received, for the detection and the separation of multiple threats potentially located on multiple targets simultaneously and in real time (i.e., signal measurement in parallel with processing of signals measured), which occurs via a final determination made by the system after combining information from each 3D microwave image, also in combination with any video images obtained.

Receiving Antennas Designed as Means for High Cross Polarization Discrimination. For frequency ranges which span more than one octave, specifically designed antennas are used to obtain reliable results by having a high level of cross polarization discrimination (XPD). XPD is defined as a ratio of the co-polar component of the specified polarization compared to the orthogonal cross-polar component over the sector or beamwidth angle, or more generally as a measurement of an antenna's ability to maintain radiated or received polarization purity between two polarizations (e.g., vertical and horizontal, co-polar and cross-polar). The higher the amount of discrimination (i.e., XPD), the less leakage there is between the polarizations. Ultra-wideband printed receiving antennas (Vivaldi type) have a low XPD of up to 2 dB in a 30-degree solid angle, which is measured from an antenna boresight (the main lobe axis), and formed by rotating the corresponding 30-degree planar angle around the main lobe axis (forming a solid angle of approximately 0.84 sr). A solid angle is thus defined as the two-dimensional angle in three-dimensional space that an object subtends at a point. The solid angles discussed here, in degrees (or more precisely, steradians, abbreviated "sr"), are the solid angles that the boundaries of the targets and/or objects within the security screening area subtend at the point of the receiving antenna. The solid angles are measured from the main lobe axis, i.e., in the maximum direction of the main lobe or antenna boresight, of the antenna radiation pattern. The solid angle is formed by rotating the planar angle around the main lobe axis. For example, for a 30-degree planar angle, the corresponding solid angle formed is 0.7-0.9 sr, or approximately 0.8 sr (where "approximately" means plus or minus 0.1 sr, throughout this description). In another example, for a 40-degree planar angle, the corresponding solid angle formed is 1.4-1.6 sr, or approximately 1.5 sr (where "approximately" means plus or minus 0.1 sr, throughout this description).

Other problems with prior art types of receiving antennas include design fragility and inability to adequately repeat electrodynamic parameters during testing from sample to sample. Prior art broadband double-ridged horn (DRH) antennas, having a maximal XPD of 18 dB in applications having a 30-degree planar angle (corresponding solid angle of approx. 0.8 sr), are also insufficient to separate signals in orthogonal polarizations in the entire range of working solid angles—up to approx. 1.5 sr—needed with the present invention. Thus, a new double-ridged antenna based on an elliptical waveguide was designed to be used with the present invention. See FIGS. 22-33 and the descriptions below.

Figure 22A:
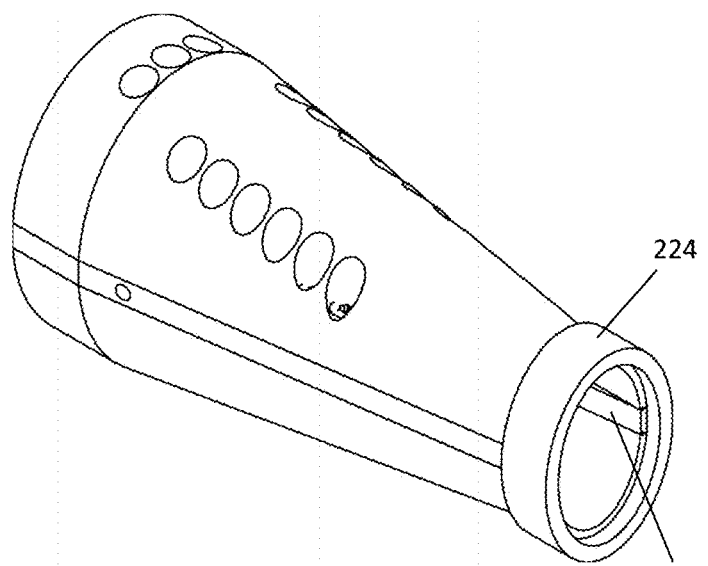
FIG. 22A shows a perspective view of an exemplary high cross polarization discrimination receiving antenna according to the present invention.
Figure 22B:
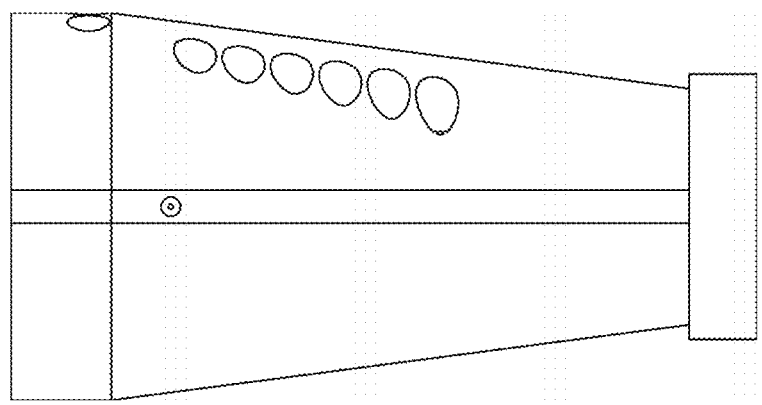
FIG. 22B shows a side view of the same antenna.
Figure 22C:
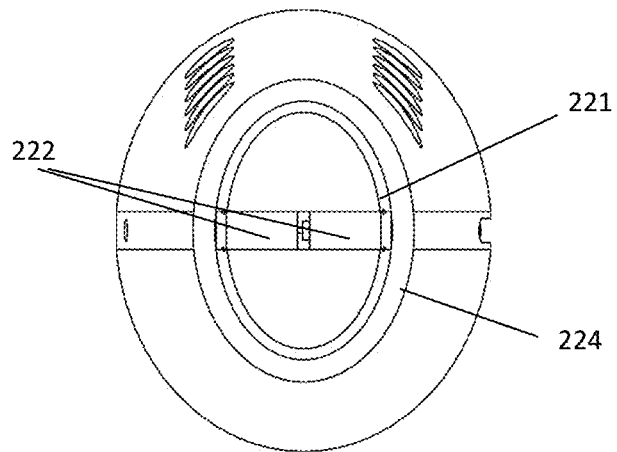
FIG. 22C shows a top view of the same antenna.

FIGS. 22A-22C show exemplary 3D and 2D models of a conically shaped elliptical double-ridged antenna according to the present invention. The antenna generally comprises an elliptical waveguide 221 having a columnar body, the columnar body having a height, a length (major axis), and a width (minor axis), the elliptical waveguide further having an interior comprising two angled ridges 222 forming a double-ridged (or dual-ridged) waveguide, the angled portions of the ridges being flat and facing each other, the ridges having a width and a space between them. The space between the ridges is largest at the open end of the elliptical waveguide and this space decreases towards the opposite end of the elliptical waveguide to form a slot between now parallel portions of each of the ridges. These now parallel and facing portions of the ridges comprise a receiving means 223 (e.g., a feedline) for further transmission of the signals captured at the slot. Furthermore, a dielectric ring 224 is positioned at the open end of the elliptical waveguide along the exterior of the body, and partially overhanging (i.e. extending past) the open end of the elliptical waveguide. The antenna is comprised of two semi-elliptical halves which are fastened together. The ridges 222 are positioned on the minor axis of the ellipse formed by the elliptical waveguide.

The conical shape of the outer part of the antenna further decreases the level of cross polarized radiations and increases the rigidity and stability of the entire structure. It is noted that an elliptically-shaped outer part is also sufficient for the same purpose; however, the conical outer shape is preferred because it makes assembly of the antenna easier. Thus, an elliptically-shaped interior combined with a conically-shaped exterior is optimal.

In the upper part of the antenna, there is a small dielectric (for example, fluoroplastic) ring, which allows to additionally reduce the level of cross-polarized radiation in the lower part of the frequency range. Thus, the dielectric ring (e.g., fluoroplastic ring, or a ring with similar dielectric proprieties to a fluoroplastic ring) further increases XPD. The conical shape of the outer part of the antenna and the dielectric ring were determined to be the best performing options for increasing XPD according to various models and experimental results, while also considering the ease of assembly of the antenna.

FIGS. 22 through 26 show varying views of an exemplary model of an elliptical dual-ridged antenna according to the present invention.

Figure 27:
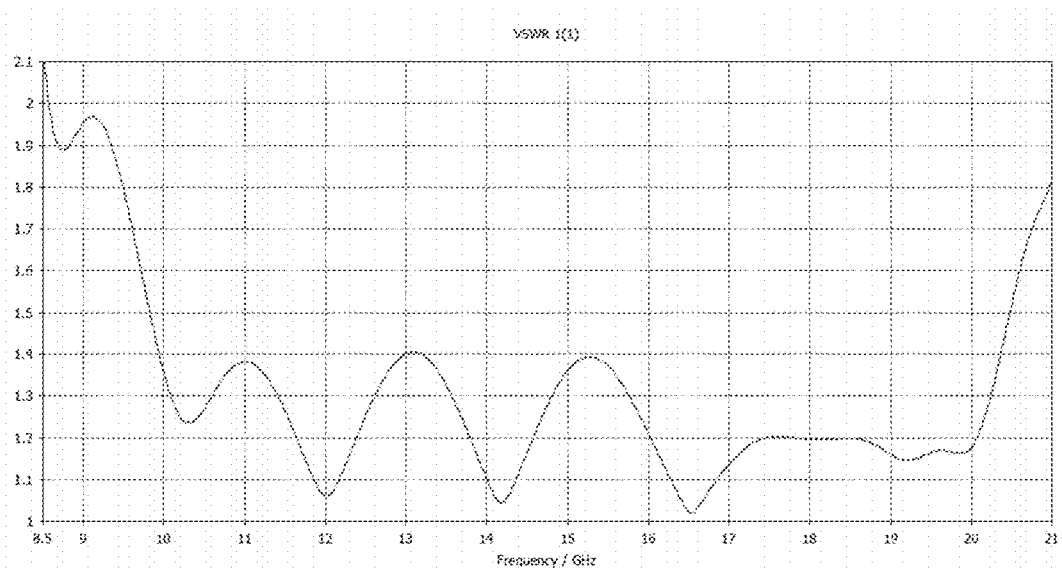
FIG. 27 shows a graph illustrating the voltage standing wave ratio (VSWR) of an elliptical dual-ridged antenna according to the present invention.

FIG. 27 shows a graph illustrating the voltage standing wave ratio (VSWR) of an elliptical dual-ridged antenna according to the present invention. It is noted that the graph shows that the VSWR of the elliptical dual-ridged antenna remains below 2 for the frequency range between 9.5 and 20 GHz.

Figure 28:
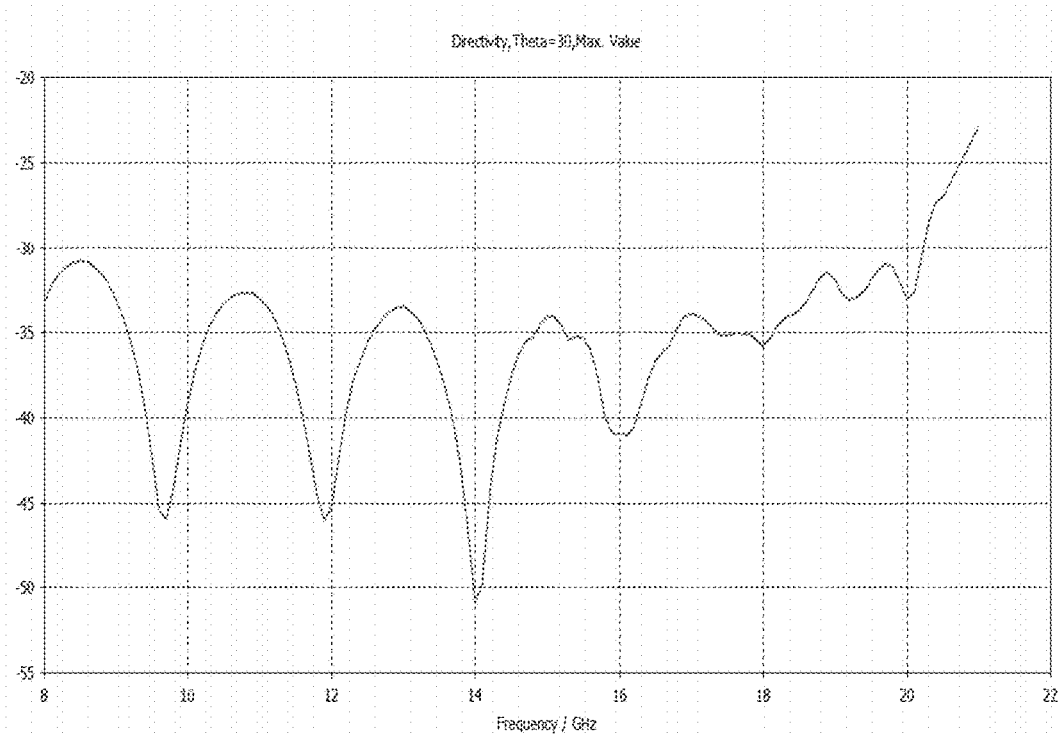
FIG. 28 shows a graph illustrating the inverted XPD (ratio of cross/co polarizations) of an elliptical dual-ridged antenna according to the present invention in a solid angle corresponding to a planar angle of 30 degrees (approx. 0.84 sr).

FIG. 28 shows a graph illustrating inverted XPD (ratio of cross/co polarizations) of an elliptical dual-ridged antenna according to the present invention in a solid angle corresponding to a 30-degree planar angle (approx. 0.8 sr). It is noted that the graph shows that the XPD of the elliptical dual-ridged antenna is greater than 30 dB throughout the range of frequencies between 9.5 and 20 GHz.

Figure 29:
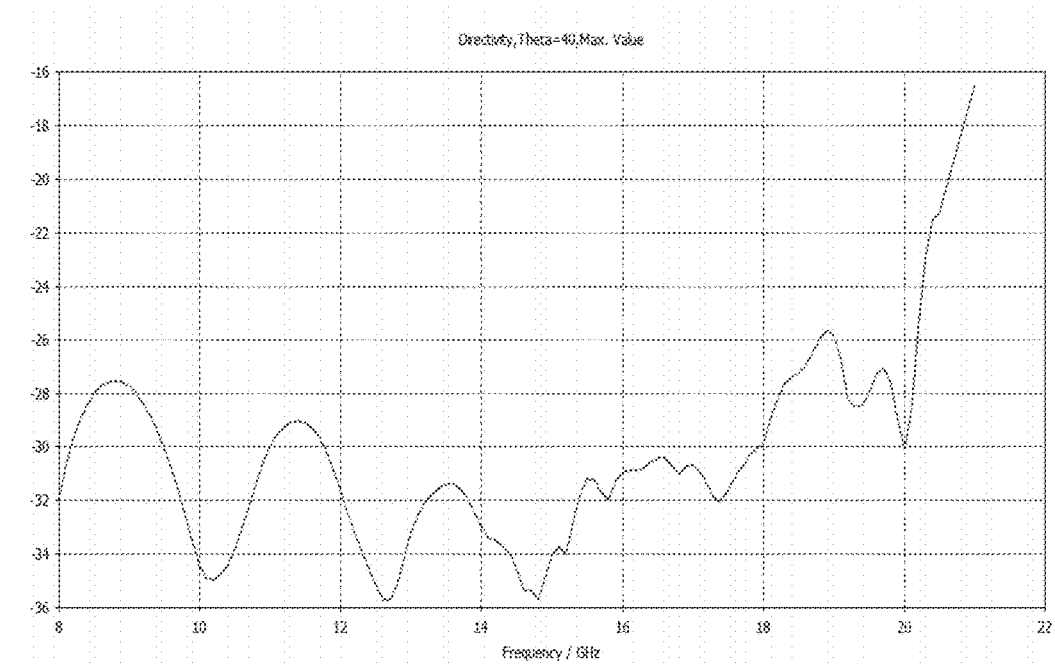
FIG. 29 shows a graph illustrating inverted XPD (ratio of cross/co polarizations) of an elliptical dual-ridged antenna according to the present invention in a solid angle corresponding to a planar angle of 40 degrees (approx. 1.5 sr).

FIG. 29 shows a graph illustrating inverted XPD (ratio of cross/co polarizations) of an elliptical dual-ridged antenna according to the present invention in a solid angle corresponding to a 40-degree planar angle (approx. 1.5 sr). It is noted that the graph shows that the XPD of the elliptical dual-ridged antenna is greater than 27 dB throughout the range of frequencies between 9.5 and 18 GHz, and greater than 25 dB throughout the range of frequencies between 18 and 20 GHz.

Figure 30:
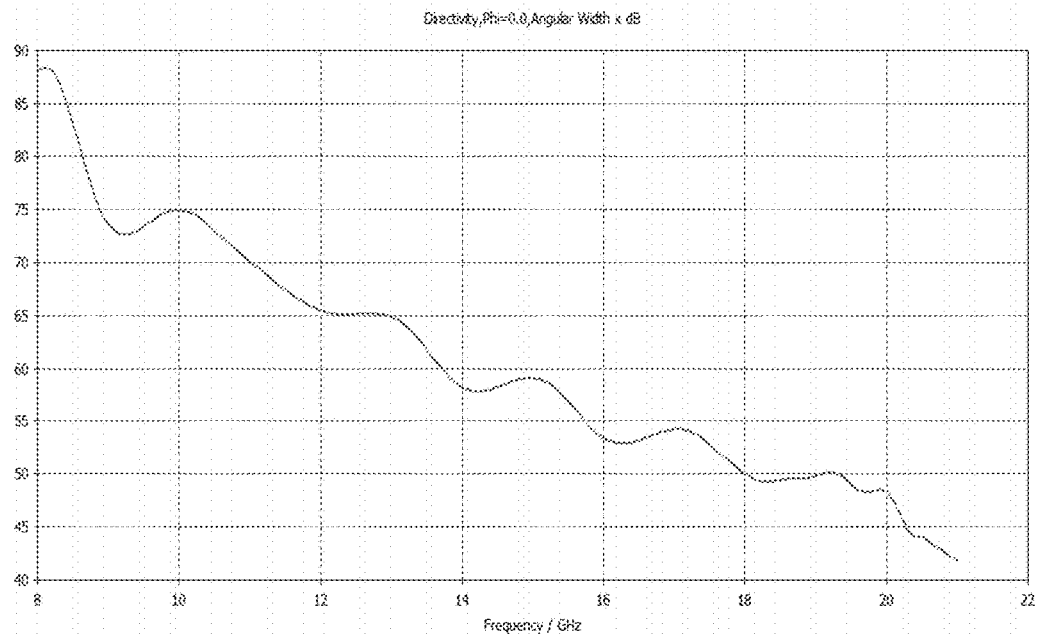
FIG. 30 shows a graph of the beamwidth of an elliptical dual-ridged antenna of the present invention at a level of minus 3 dB (half power) in the plane, Phi=0 degrees.

FIG. 30 shows the beamwidth of an elliptical dual-ridged antenna of the present invention at a level of minus 3 dB (half power) in the plane, Phi=0 degrees. According to this graph, the beamwidth of the antenna is about 48-75 degrees in a frequency band between 20 and 9.5 GHz, showing that the elliptical dual-ridged antenna has sufficient beamwidth in a first plane for receiving microwave signals at angles formed by the security screening area.

Figure 31:
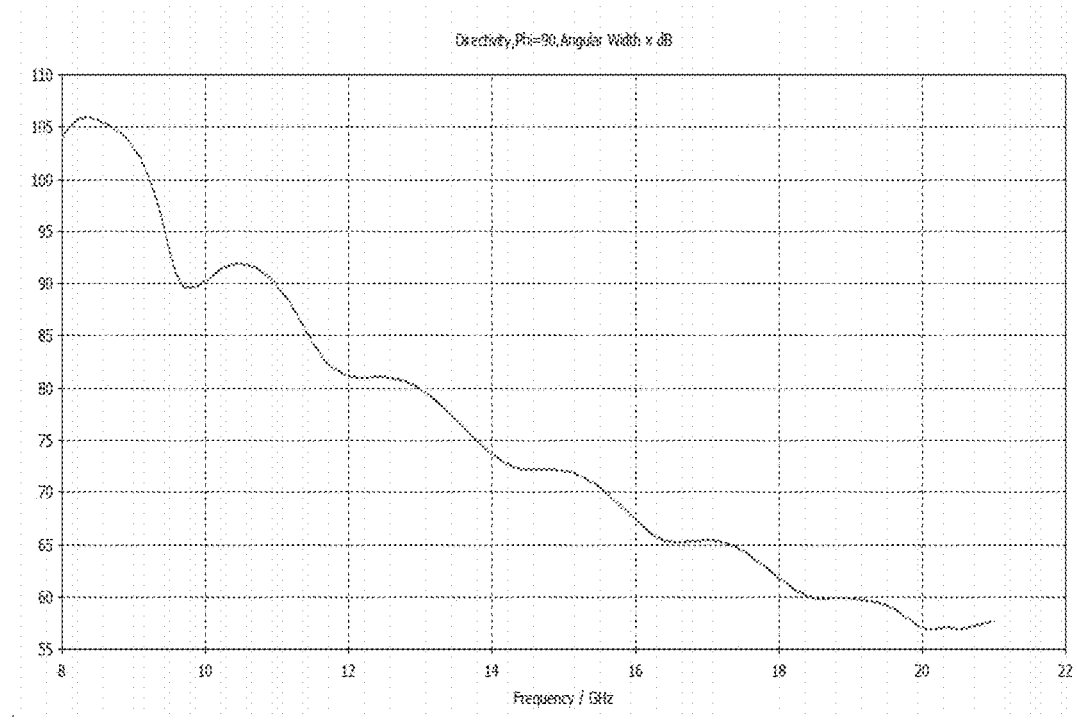
FIG. 31 shows a graph of the beamwidth of an elliptical dual-ridged antenna of the present invention at a level of minus 3 dB in the plane, Phi=90 degrees.

FIG. 31 shows the beamwidth of an elliptical dual-ridged antenna of the present invention at a level of minus 3 dB in the plane, Phi=90 degrees. According to this graph, the beamwidth of the antenna is about 57-95 degrees in a frequency band between 20 and 9.5 GHz, showing that the elliptical dual-ridged antenna has sufficient beamwidth in a second cross-plane for receiving microwave signals at angles formed by the security screening area.

The results of a simulation of an elliptical dual-ridged antenna of the present invention are as follows: the voltage standing wave ratio (VSWR) levels are less than 2 (as shown in FIG. 27) and cross-polarization discrimination (XPD) in a corresponding 30-degree solid angle of at least 30 dB in a frequency band between 9.5 and 20 GHz (as shown in FIG. 28). Furthermore, the antenna has an XPD in a corresponding 40-degree solid angle of at least about 26 dB in a frequency band between 9.5 and 20 GHz (as shown in FIG. 29).

Figure 23:
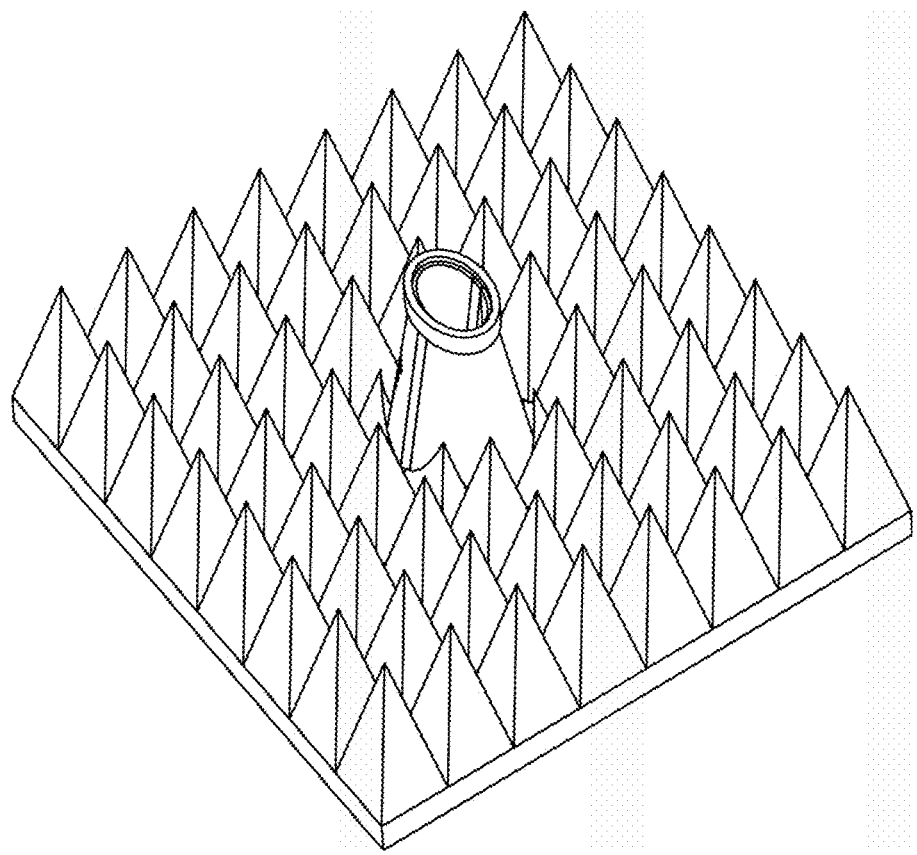
FIG. 23 shows a perspective view of an exemplary high cross polarization discrimination receiving antenna in an array of absorbing material.
Figure 24A:
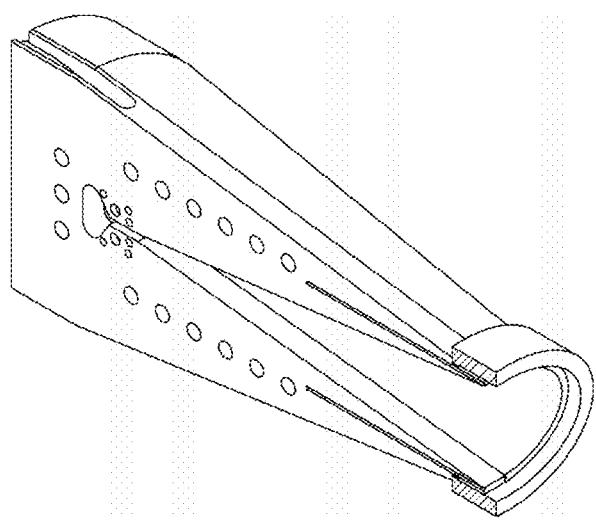
FIG. 24A shows a perspective cross-sectional view of a first half of an exemplary high cross polarization discrimination receiving antenna according to the present invention.
Figure 24B:
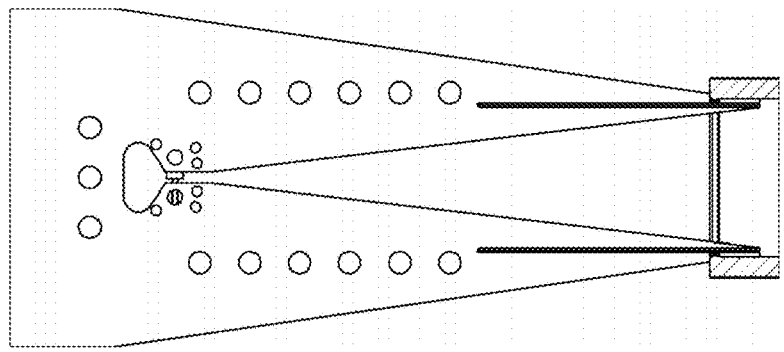
Figure 25A:
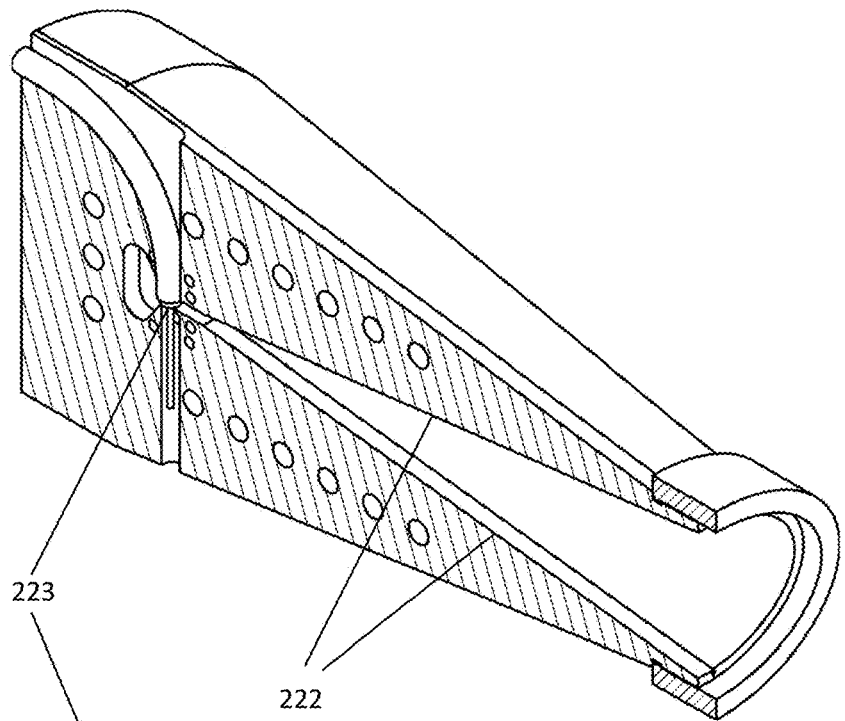
FIG. 25A shows a perspective cross-sectional view of a second half of an exemplary high cross polarization discrimination receiving antenna according to the present invention.
Figure 25B:
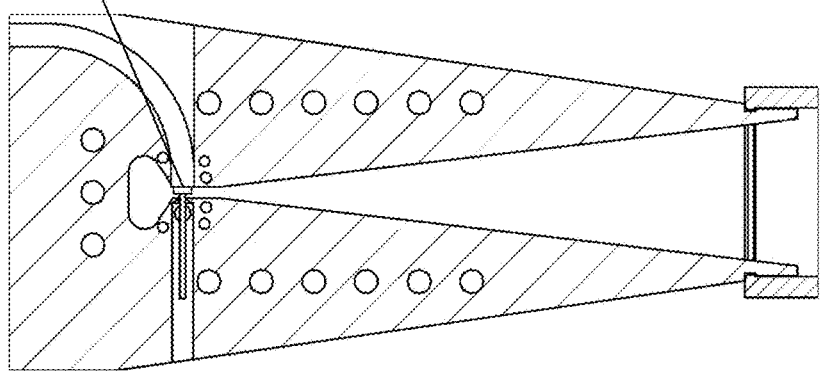
Figures 26A, 26B:
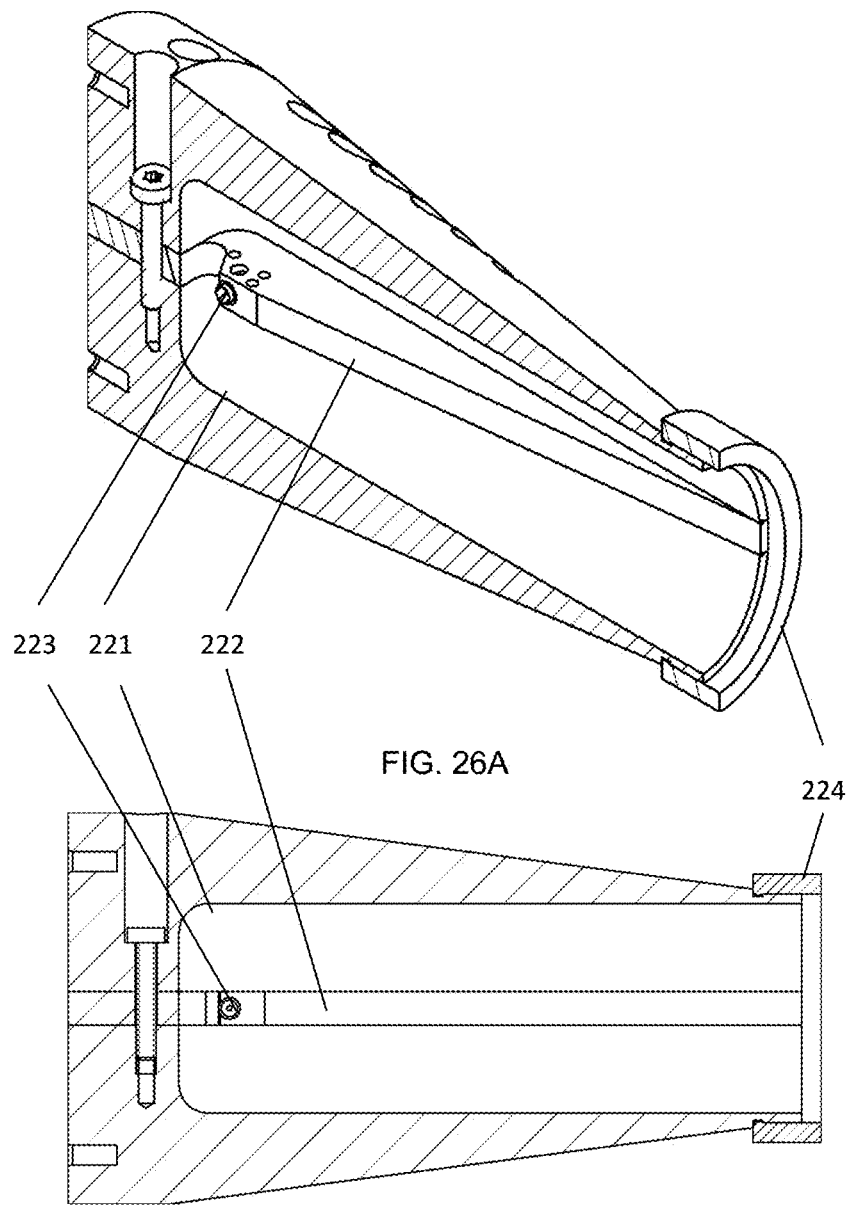

To maintain this level of XPD in the formation of an ensemble of receiving elliptical dual-ridged antennas, it is necessary to use an array of absorbing material, for example ECCOSORB VHP-2-NRL, surrounding the antenna. An example of installing an antenna in an array of absorbing material is shown in FIG. 23.

Figure 32:
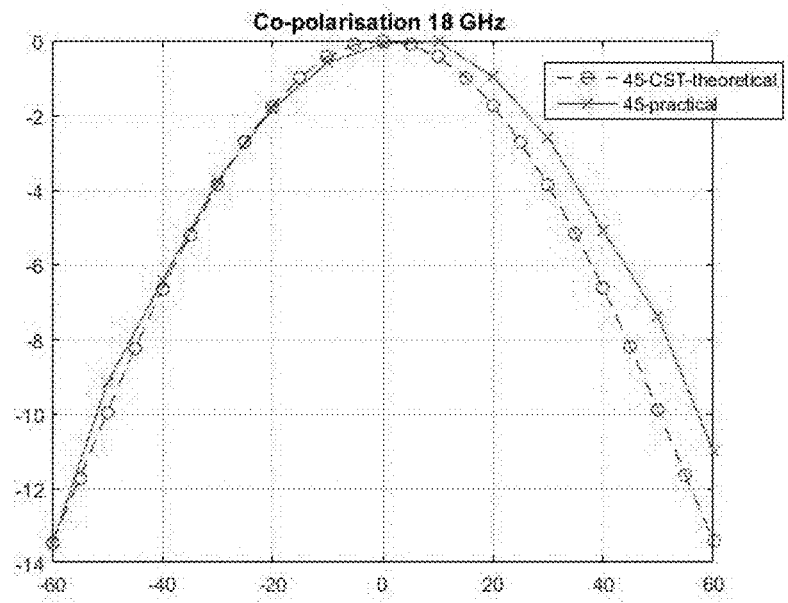
FIG. 32 shows a graph of theoretical versus measured data of the normalized gain of an elliptical dual-ridged antenna of the present invention at 18 GHz in the plane, Phi=45 degrees.
Figure 33:
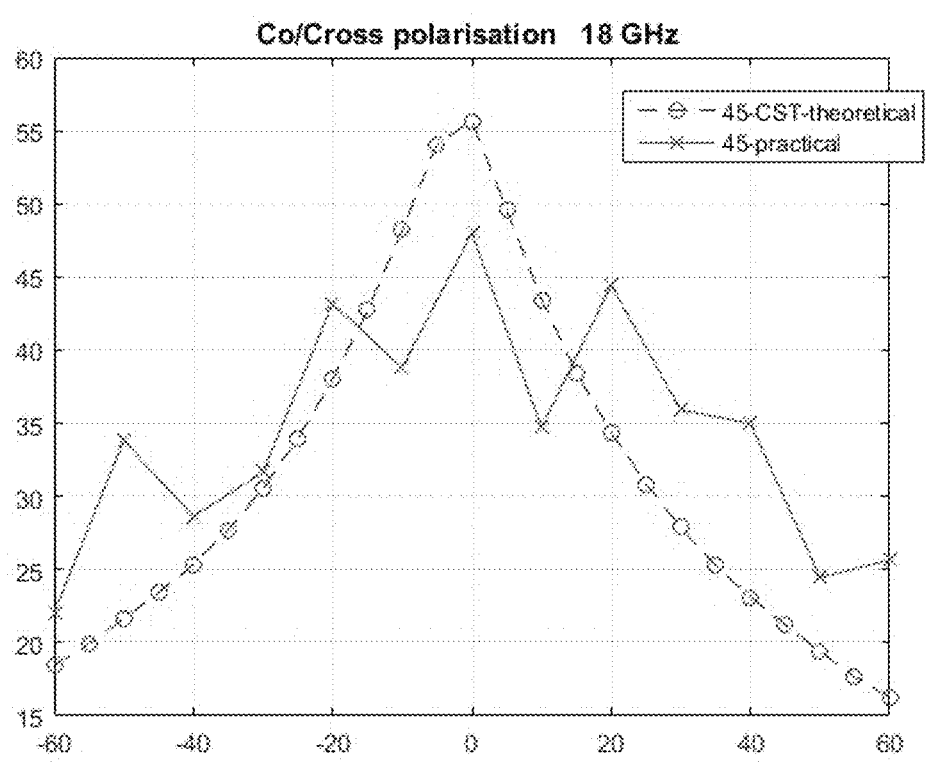
FIG. 33 shows a graph of theoretical versus measured data of the XPD versus solid angle amount of an antenna of the present invention, at 18 GHz in the plane, Phi=45 degrees.

Some results of the investigation of the electrodynamic parameters of the dual ridged antenna of the present invention are provided in FIGS. 32-33. Both figures illustrate that the actual (i.e. practical) results using the elliptical dual-ridged antennas are very close to the theoretical and ideal results. On the figures, actual result data points are marked with "x" and theoretical result data points are marked with "o." FIG. 32 shows theoretical versus measured data of the normalized antenna gain at 18 GHz in the plane, Phi=45 degrees. FIG. 33 shows theoretical versus measured data of the XPD (ratio of co/cross polarizations) versus solid angle amount of the antenna of the present invention, at 18 GHz in the plane, Phi=45 degrees.

Analysis of experimental studies of the developed and fabricated elliptical dual-ridged antenna shows that the experimental data obtained and the simulation results are well correlated. The conclusion of the experimental studies is the following: a small two-ridge elliptical antenna of a rigid construction with a matching level of VSWR of no more than 2 and cross-polarization discrimination (XPD) in a corresponding 30-degree solid angle of at least 27-30 dB in a range of frequencies overlapping an octave (9.5-20 GHz) has been developed and manufactured. Such antennas are beneficial as replacements for the receiving antennas discussed herein, especially due to their higher XPD values. By placing a first elliptical dual-ridged antenna at a first angle (e.g., 0 degrees) relative to the initial polarization of a primary beam produced by a transmitting antenna and placing a second elliptical dual-ridged antenna at a second angle (e.g., 90 degrees) relative to the initial polarization of a primary beam produced by the transmitting antenna, co- and cross-polarizations are detected, each with a significantly higher XPD than previously possible. Thus, based on their orientation, the antennas are able to discriminate among signals in orthogonal polarizations (i.e. cross- and co-polarizations) in the entire range of working solid angles—corresponding up to 40 planar degrees (up to 1.5 sr)—required by the security system areas of the present invention. Replacement of receiving antennas with elliptical dual-ridged antennas as discussed in this section creates optimal detection results because the higher discrimination between polarizations makes for more reliable and accurate systems for security scanning.

High Probability of Detection Coupled with a Low False Alarm Rate. The ability of the present invention to process data in real time, and to collect and analyze all frames during a subject's movement within the zone of inspection, allow for a high probability of detection. The ability of the present system to combine information from two receiving blocks (e.g., explosives and metal detection) increases the performance of the processing and analysis of signals but also lowers the chances of a false alarm which would disturb the movement of all subjects within the inspection area.

Applications of the Present Systems and Methods. When planning a deployment of an inspection technology, one should consider both how it would affect the innocent general public and how it would help to prevent an offender from carrying illicit substances or objects, or a terrorist from carrying out an attack.

In the case of cooperative inspection, the inspected person (whether it is a terrorist or not) always knows about the fact of inspection, while in the case of non-cooperative inspection, this is not necessarily the case. Knowing about the inspection deters the terrorist, while also making it relatively easier for the terrorist to prepare for and avoid being detected. In the case of non-cooperative inspection, the inspected target may or may not know about the fact of inspection.

In both cases: (1) There is no negative effect of human factor on detection; (2) Inspection causes no inconvenience for the site; (3) Inconvenience only for those causing false alarms; others are not affected; (4) No queues, no staff, so the effect of explosion at the checkpoint could be less deadly.

If the inspection is covert, then there is no risk from explosion at the inspection point, since it is not an attractive target. Also, the probability of detecting a threat may be higher than if the terrorist is aware of the inspection, even though the nominal detection probability of a non-cooperative technology may be lower than that of the technology that requires cooperation.

With these points in mind, one can envisage two main ways of using the present invention: (1) Open inspection, comprising an early warning system operating well before the subjects are actually entering the protected area (e.g., in the street, hundreds of meters away from the entrance to a mass transit hub, such as a stadium or a train station). It will signal the possibility of a high-risk target, which should be attended to by a relevant procedure; (2) Covert inspection: a standalone system installed at some distance from the protected area (e.g., military checkpoint) or within an area, e.g., with high crime risk (e.g., an area with a high proliferation of illegal guns). The system will quietly inform the military personnel or law enforcers about the potential threat or illegal activity. In both cases, the present invention can be combined with a facial recognition technology and database, which may provide identification of the threat carrier while he or she is still at a safe distance.

Alarm signals produced by the present invention include information about the type of the threat and the location of the threat, as well as photographs of the suspected offenders, which may be used in the context of a broader security network featuring, e.g., facial recognition, automatic doors, etc.

The present invention generally describes apparatuses, including portals and detectors for detecting hazardous and/or radioactive materials, and methods for signal processing, decision making and/or for using the apparatuses. It should be understood that these apparatuses and methods are adapted to be used on a variety of subjects and in a variety of settings, including people, packages, conveyances, buildings, outdoor settings, and/or indoor settings. Also, within the scope of the invention is firmware, hardware, software and computer readable-media including software which is used for carrying out and/or guiding the methodologies described herein, particularly with respect to radioactive (and nuclear) threat detection. Hardware optionally includes a computer, the computer optionally comprising a processor, memory, storage space and software loaded thereon. The present invention has been described using detailed descriptions of embodiments thereof that are provided by way of example and are not intended to limit the scope of the invention. The described embodiments comprise different features, not all of which are required in all embodiments of the invention. Some embodiments of the present invention utilize only some of the features or possible combinations of the features. Variations of embodiments of the present invention that are described and embodiments of the present invention comprising different combinations of features noted in the described embodiments will occur to persons of the art. When used in the following claims, the terms "comprises", "includes", "have" and their conjugates mean "including but not limited to". The scope of the invention is limited only by the following claims.

The description of a preferred embodiment of the invention has been presented for purposes of illustration and description. It is not intended to be exhaustive or to limit the invention to the precise forms disclosed. Obviously, many modifications and variations will be apparent to practitioners skilled in this art. It is intended that the scope of the invention be defined by the following claims and their equivalents.

Moreover, the words "example" or "exemplary" are used herein to mean serving as an example, instance, or illustration. Any aspect or design described herein as "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

What is claimed is:

1. A method for determining a presence of a threat on one or more targets in a security checkpoint, comprising:
    transmitting microwave signals at one or more targets within a security checkpoint area, wherein said microwave signals reflect or transmit through one or more objects on said one or more targets, receiving said microwave signals via a means for cross polarization discrimination (XPD), said means for XPD separating orthogonal polarizations of said microwave signals,
    calculating a dielectric permittivity value of one or more objects, said dielectric permittivity value corresponding to a variation in a microwave radiation reflected off or transmitted through said one or more objects, and
    processing said orthogonal polarizations, thus forming a ratio of co- and cross-polarizations for said one or more objects,
    said ratio of co- and cross-polarizations and said dielectric permittivity value corresponding to a presence or an absence of a threat in the security checkpoint.

2. The method of claim 1, wherein said means for XPD comprises two or more antennas, each antenna comprising an elliptical waveguide and two ridges.

3. The method of claim 2, said two or more antennas each further comprising a truncated conical exterior.

4. The method of claim 2, said two or more antennas each further comprising a dielectric ring positioned around an open end of the elliptical waveguide.

5. The method of claim 2, wherein said two ridges are positioned on a minor axis of the elliptical waveguide.

6. The method of claim 1, wherein said means for cross-polarization discrimination comprises two or more antennas having a voltage standing wave ratio of less than 2 for a frequency range between 9.5 and 20 GHz.

7. The method of claim 1, wherein said means for cross-polarization discrimination has a cross-polarization discrimination value of more than 30 dB throughout a range of frequencies between 9.5 and 20 GHz in a solid angle of 0.7-0.9 sr.

8. The method of claim 1, wherein said means for cross-polarization discrimination has a cross-polarization discrimination value of more than 25 dB throughout the range of frequencies between 9.5 and 20 GHz in a solid angle of 1.4-1.6 sr.

9. The method of claim 2, wherein said at least 2 antennas are positioned at 90-degree angles relative to each other.

10. The method of claim 1, wherein the means for XPD comprises two or more antennas, each antenna being surrounded by an array of absorbing material.

11. The method of claim 2, wherein the two or more antennas each comprises two semi-elliptical halves which are fastened together.

12. A system for determining a presence of a threat on one or more targets in a security checkpoint, comprising:
one or more transmitters for transmitting microwave signals at one or more targets within a security checkpoint area, wherein said microwave signals reflect or transmit through one or more objects on said one or more targets,
two or more receivers for receiving said microwave signals, said two or more receivers comprising a means for cross polarization discrimination (XPD), said means for XPD separating orthogonal polarizations of said microwave signals,
a first processor for calculating a dielectric permittivity value of one or more objects, said dielectric permittivity value corresponding to a variation in a microwave radiation reflected off or transmitted through said one or more objects, and
a second processor for comparing said orthogonal polarizations of said microwave signals, thus forming a ratio of co- and cross-polarizations for said one or more objects,
said ratio of co- and cross-polarizations and said dielectric permittivity value corresponding to a presence or an absence of a threat in the security checkpoint.

13. The system of claim 12, wherein said means for XPD comprises two or more antennas, each antenna comprising an elliptical waveguide and two ridges.

14. The system of claim 13, said two or more antennas each further comprising a truncated conical exterior.

15. The system of claim 14, said two or more antennas each further comprising a dielectric ring positioned around an open end of the elliptical columnar body.

16. The system of claim 12, wherein said means for cross-polarization discrimination has a cross-polarization discrimination value of more than 30 dB throughout a range of frequencies between 9.5 and 20 GHz in a solid angle of 0.7-0.9 sr.

17. The system of claim 12, wherein said means for XPD comprises at least 2 antennas, each antenna comprising an elliptical waveguide and two ridges.

18. The system of claim 17, wherein said at least 2 antennas are positioned at 90-degree angles relative to each other.

19. The system of claim 12, wherein each receiver comprises an antenna surrounded by an array of absorbing material.

20. The system of claim 12, wherein said means for cross-polarization discrimination has a cross-polarization discrimination value of more than 25 dB throughout the range of frequencies between 9.5 and 20 GHz in a solid angle of 1.4-1.6 sr.

* * * * *